(12) United States Patent
Park et al.

(10) Patent No.: US 7,843,731 B2
(45) Date of Patent: Nov. 30, 2010

(54) MEMORY ARRAY ARCHITECTURE FOR A MEMORY DEVICE AND METHOD OF OPERATING THE MEMORY ARRAY ARCHITECTURE

(75) Inventors: Ki-Tae Park, Gyeonggi-do (KR); Jung-Dal Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 12/166,246

(22) Filed: Jul. 1, 2008

(65) Prior Publication Data

US 2008/0266952 A1    Oct. 30, 2008

Related U.S. Application Data

(62) Division of application No. 11/371,051, filed on Mar. 7, 2006, now Pat. No. 7,408,806.

(30) Foreign Application Priority Data

Mar. 7, 2005    (KR) .............................. 2005-18766

(51) Int. Cl.
*G11C 16/04* (2006.01)
(52) U.S. Cl. ............... 365/185.05; 365/63; 365/185.11; 365/185.12; 365/185.17
(58) Field of Classification Search ............ 365/185.05, 365/63, 185.11, 185.12, 185.17
See application file for complete search history.

(56) References Cited

U.S. PATENT DOCUMENTS

| 4,962,481 | A | * | 10/1990 | Choi et al. ............. | 365/185.17 |
|---|---|---|---|---|---|
| 5,168,334 | A | | 12/1992 | Mitchell et al. | |
| 5,635,747 | A | * | 6/1997 | Lee et al. ................... | 257/386 |
| 5,680,347 | A | * | 10/1997 | Takeuchi et al. ....... | 365/185.17 |
| 5,768,192 | A | | 6/1998 | Eitan | |
| 5,812,454 | A | | 9/1998 | Choi | |
| 5,936,887 | A | * | 8/1999 | Choi et al. ............. | 365/185.17 |
| 6,028,788 | A | * | 2/2000 | Choi et al. ............. | 365/185.11 |
| 6,061,280 | A | * | 5/2000 | Aritome ................... | 365/195 |
| 6,118,696 | A | * | 9/2000 | Choi ..................... | 365/185.11 |

(Continued)

FOREIGN PATENT DOCUMENTS

JP    2001-148434    5/2001

(Continued)

OTHER PUBLICATIONS

English language abstract for Japanese Publication No. 2001-148434.

(Continued)

*Primary Examiner*—Viet Q Nguyen
(74) *Attorney, Agent, or Firm*—Myers Bigel Sibley & Sajovec, PA

(57) ABSTRACT

A high integration memory array architecture of the present invention includes a memory cell array including memory cells arranged in a predetermined configuration, and selection transistors having different threshold voltages so as to select a memory string of the memory cell array. By applying a proper bias voltage to the selection transistors, specific memory strings can be selected, so that operations for the memory array can be performed without intervening with adjacent memory cells.

6 Claims, 21 Drawing Sheets

U.S. PATENT DOCUMENTS

| | | |
|---|---|---|
| 6,248,633 B1 | 6/2001 | Ogura et al. |
| 6,388,293 B1 | 5/2002 | Ogura et al. |
| 6,477,083 B1 | 11/2002 | Fastow et al. |
| 6,650,567 B1 * | 11/2003 | Cho et al. ............... 365/185.17 |
| 6,706,599 B1 | 3/2004 | Sadd et al. |
| 6,768,681 B2 | 7/2004 | Kim |
| 6,996,011 B2 * | 2/2006 | Yeh et al. ............... 365/185.26 |
| 7,006,378 B1 * | 2/2006 | Saito et al. ............. 365/185.05 |
| 7,177,191 B2 * | 2/2007 | Fasoli et al. ............ 365/185.17 |
| 7,203,092 B2 * | 4/2007 | Nazarian ............... 365/185.17 |
| 7,227,232 B2 * | 6/2007 | Liou et al. .................. 257/390 |
| 7,289,364 B2 * | 10/2007 | Zanardi ................. 365/185.09 |
| 7,408,806 B2 * | 8/2008 | Park et al. .............. 365/185.17 |
| 7,450,422 B2 * | 11/2008 | Roohparvar ........... 365/185.17 |
| 7,498,630 B2 * | 3/2009 | Ichige et al. ................. 257/314 |
| 7,508,714 B2 * | 3/2009 | Fasoli et al. ............ 365/185.18 |
| 7,547,941 B2 * | 6/2009 | Chen ......................... 257/320 |
| 7,551,480 B2 * | 6/2009 | Park et al. .............. 365/185.11 |
| 7,592,666 B2 * | 9/2009 | Noguchi et al. ............. 257/324 |
| 7,710,774 B2 * | 5/2010 | Chen et al. ............. 365/185.05 |
| 2004/0127062 A1 | 7/2004 | Kim |
| 2005/0184327 A1 | 8/2005 | Ozawa |

FOREIGN PATENT DOCUMENTS

| | | |
|---|---|---|
| JP | 2003-17600 | 1/2003 |
| JP | 2004-80022 | 3/2004 |
| KR | 2002-0082668 | 10/2002 |
| KR | 10-2004-0016684 | 2/2004 |

OTHER PUBLICATIONS

English language abstract for Korean Publication No. 2002-0082668.

English language abstract for Japanese Publication No. 2003-017600.

English language abstract for Korean Publication No. 10-2004-0016684.

English language abstract for Japanese Publication No. 2004-080022.

* cited by examiner

MEMORY ARRAY ARCHITECTURE FOR A MEMORY DEVICE AND METHOD OF OPERATING THE MEMORY ARRAY ARCHITECTURE

CROSS-REFERENCE TO RELATED APPLICATIONS

This is a Divisional of U.S. patent application Ser. No. 11/371,051, filed on Mar. 7, 2006, now U.S. Pat. No. 7,408,806, which claims priority under 35 U.S.C. §119 from Korean Patent Application 2005-18766 filed on Mar. 7, 2005, the entire contents of which are hereby incorporated by reference.

BACKGROUND

1. Field of the Invention

The present invention relates to a memory device, and more particularly, to a memory array for a non-volatile memory device and a method of operating the memory array.

2. Description of the Related Art

Erasable and programmable read only memory (EPROM), electrically erasable and programmable ROM (EEPROM), Flash EEPROM, etc., are non-volatile memory devices, which maintain stored data even when a power supply is stopped.

Recently, non-volatile memory devices using a non-conductor that can locally trap charges have been the subject of publications because they have a simple fabrication process and can procude a more highly integrated memory chip using photolithography-etching compared with conventional non-volatile memory devices using a floating gate. A representative example of non-conductors capable of trapping charges is a silicon nitride layer. Typically, an oxide-nitride-oxide (ONO) layer, in which a silicon nitride layer is sandwiched between two oxide layers, is used as a charge storage layer for the non-volatile memory devices.

A prior art non-volatile memory device using ONO layer is disclosed in U.S. Pat. No. 5,168,334 issued to Alan T. Mitchel et al. FIG. 1A is a schematic sectional view of a non-volatile memory device as disclosed by Alan T. Mitchel in U.S. Pat. No. 5,168,334, and FIG. 1B is an equivalent circuit diagram of FIG. 1A. In FIGS. 1A and 1B, reference numeral 1 represents a substrate, reference numeral 3 represents an ONO layer of oxide-nitride-oxide, reference numeral 5 represents a gate, and reference numeral 7 represents source/drain regions.

Referring to FIGS. 1A and 1B, the non-volatile memory device includes the ONO layer 3 (including an oxide layer 2a, a nitride layer 2b, and another oxide layer 2c) and the gate 5 sequentially stacked on the substrate 1, and is a single bit non-volatile memory device 6 which expresses either logic '0' or logic '1' depending on whether a charge trapped in a nitride layer 2b of the ONO layer 3 exists or not. However, a memory device that can express two or more states to increase the information storage capability without increasing the size of the memory device is desirable.

In actual application, non-volatile memory devices are often used in a large memory array. Since the semiconductor industry requires a high integration of semiconductor devices that can store more information in a smaller-sized package, it is necessary to package many memory cells in a memory array. Further, the memory array should be fabricated as small as possible. For this purpose, Richard M. Fastow et al. discloses a memory array 900 shown in FIG. 2 in U.S. Pat. No. 6,477,083. In the memory array 900, Richard M. Fastow et al. discloses a virtual ground structure which does not use a common source line for all transistors constituting the memory array 900.

Referring to FIG. 2, the virtual ground structure by Richard M. Fastow et al. includes a memory cell array 904, word lines 1001, 1003, 1005, bit lines 802, 804, 806, 810 and selection transistors 840, 842, 846, 848. The bit lines are connected to memory cells in a row direction, and the selection transistors are connected to the bit lines alternatively at an upper portion and a lower portion of the memory array 904. The selection transistors 840 and 842 in odd columns are connected to each other while sharing a drain 828, and the selection transistors 846 and 848 in even columns are connected to each other while sharing the drain 829. In the aforementioned virtual ground structure, source or drain of a selected memory cell is activated (or accessed) by properly biasing the selection transistors.

However, the memory array structure 900 shown in FIG. 2 may cause a neighbor cell effect, which is caused by a non-selected memory cell in a read operation and results in deterioration in the sensing margin. For example, it is assumed that bit information stored in a memory cell 101 is read. For this purpose, when 5 V is applied to the word line, 2.5 V is applied to the bit line 806, and the ground voltage (0 V) is applied to the bit line 802, memory cells 103 and 105, at both sides of the selected memory cell 101, are turned on so that all the memory cells to which the selected memory cell 101 pertains, i.e., all the memory cells in a direction of the selected word line 1003 are basically turned on. Thus a voltage applied to the drain and source of the selected memory cell 101 or an output voltage therefrom may be adversely influenced. Accordingly, a new memory array structure that can secure a reliable operation is required.

To accomplish a high integration that can store more information in a smaller sized package, it is required that the size of memory cells packaged in a memory array should be small so that more information bits can be stored in the same memory cell size.

To this end, a variety of two bits non-volatile memory devices are introduced. For instance, U.S. Pat. No. 5,768,192 assigned to Boaz Eitan et al., U.S. Pat. No. 6,706,599 assigned to Michael Sadd et al., U.S. Pat. No. 6,248,633 assigned to Seiki Ogura et al., or the like disclose two bit non-volatile memory devices.

FIG. 3A is a sectional view schematically showing a memory device disclosed in U.S. Pat. No. 5,768,192 to Boaz Eitan et al., and FIG. 3B is an equivalent circuit diagram of FIG. 3A. In FIGS. 3A and 3B, reference numeral 21 represents a substrate, reference numeral 23 represents an ONO layer, reference numeral 22a represents an oxide layer, reference numeral 22b represents a nitride layer, reference numeral 22c represents an oxide layer, reference numeral 25 represents a gate, and reference numeral 27 represents source/drain regions. Unlike the non-volatile memory device of FIG. 1A, the non-volatile memory device to Boaz Eitan et al., is characterized in that the nitride layer 22b of the ONO layer 23 has two positions of charge trap regions 24L and 24R. Charges are selectively and independently stored in the charge trap regions 24L and 24R of the nitride layer 22b. This non-volatile memory device uses a channel-hot-electron (CHE) to inject electrons into the charge storing nitride layer 22b and injects hot-holes (HH), generated in a band-to-band-tunnel (BTBT) method, into the charge trap region so as to remove the electrons injected into the charge trap regions 24L and 24. This non-volatile memory device injects charges into the charge trap regions 24L and 25R selectively and independently by applying a proper bias voltage to the gate 25, source 27, drain 27, and substrate 21 of the memory device, respectively.

As shown in FIG. 3B, the non-volatile memory device of FIG. 3A can be represented by three transistors 26L, 26C, and 26R having respective channels Ls1, Lc, and Ls2 and connected in series. Threshold voltages of the memory devices, i.e., the memory transistor 26L having the channel Ls1 and the memory transistor 26R having the channel Ls2, are varied depending on the amount of charges injected into the charge trap regions.

Similarly to the memory device of FIG. 1A, this non-volatile memory device is advantageous in that it can have a simple structure with relatively low fabrication costs, thereby allowing an inexpensive memory chip to be realized. However, since one gate 25 has to control the three transistors 26L, 26C, and 26R, an applied operation voltage is severely limited, so that a signal difference, i.e., the sensing margin characteristic, between bit information of the memory device, logic '1' and logic '0', is lowered. In particular, for highly integrated devices, the device size is decreased making the distance between the drain 27 and the source 27 smaller. In other words, the charge trap regions 24L and 24R become adjacent to each other. Since the charges stored in the insulation nitride layer 22b are laterally diffused and gradually moved toward the channel direction of the device, the effective distance between the two charge trap regions 24L and 24R becomes narrower, and at the worst, the two charge trap regions 24L and 24R are physically connected to each other, so that a phenomenon occurs where the two different bit informations cannot be differentiated from each other. This problem is very serious in that it is counterproductive to the scaling down to accomplish low prices and high device density.

FIG. 4A is a sectional view schematically showing the non-volatile memory device disclosed in U.S. Pat. No. 6,706, 599 to Michael Sadd et al., and FIG. 4B is an equivalent circuit diagram of FIG. 4A. In FIGS. 4A and 4B, reference numeral 31 represents a substrate, reference numeral 33 represents an ONO layer, reference numeral 32a represents an oxide layer, reference numeral 32b represents a nitride layer, reference numeral 32c represents an oxide layer, reference numeral 35 represents a gate, and reference numeral 37 represents source/drain regions. Unlike the non-volatile memory device of FIG. 3A, the non-volatile memory device of FIG. 4A is characterized by having a nitride layer 32b of the ONO layer 33 that can store charges in physically separated regions. According to this non-volatile memory device, although the device size is decreased, two different charge trap regions 34L and 34R are not electrically connected by a diffusion of charges. Although the structure of FIG. 4A has an advantage in that the device size is further scaled down while maintaining the same operation characteristics as those of the non-volatile memory device of FIG. 3A, this non-volatile memory device still has to control three transistors 36L, 36C, and 36R using one gate 35 like the device of FIG. 3A. Therefore, an applied operation voltage is rigorously limited, so that a signal difference, i.e., the sensing margin characteristic, between bit information of the memory device, logic '1' and logic '0', is lowered.

FIG. 5A is a sectional view schematically showing the memory device disclosed in U.S. Pat. No. 6,248,633 to Seiki Ogura et al., and FIG. 5B is an equivalent circuit diagram of FIG. 5A. In FIGS. 5A and 5B, reference numeral 41 represents a substrate, reference numeral 43 represents an ONO layer, reference numeral 42a represents an oxide layer, reference numeral 42b represents a nitride layer, reference numeral 42c represents an oxide layer, reference numerals 45L and 45R represent a control gate, reference numeral 47 represents source/drain regions, and reference numeral 49 represents a select gate. This non-volatile memory device includes the control gates 45L and 45R, which are disposed at both sidewalls of the select gate 49 and independently controllable, and the ONO layer 43 having charge trap regions 44L and 44R respectively disposed below the control gates 45L and 45R. The select gate 49 between the control gates 45L and 45R is insulated by an oxide layer 42g from the substrate 41 and insulated by an oxide layer 42s from the control gates 45L and 45R. Since the non-volatile memory device can be formed using a process for forming a sidewall of a MOS transistor, it has an advantage that the control gates 45L and 45R are physically formed in a nano-scale size to decrease the overall size of the device. Also, since the independent control gates 45L and 45R are formed in the respective charge trap regions 44L and 44R and the select gate 49 can be separately controlled, optimal voltages can be applied to the respective gates. As a result, a signal difference, i.e., sensing margin characteristic, between bit information of the memory device, logic '1' and logic '0', is enhanced. However, in the prior art non-volatile memory device, the number of gates to be controlled is high, which complicates a peripheral circuit needed to operate and control the devices. Also, since the role of the select gate 49 is not necessarily needed according to the charge injection method (program/erase mechanism), it has an additional structure that may prevent optimal scaling down of the device.

Accordingly, it is desirable to develop a low price, high density, and highly reliable non-volatile memory device.

SUMMARY

Exemplary embodiments of the present invention provide a memory array architecture for memory devices. Additional exemplary embodiments of the present invention provide a method of operating the memory array architecture.

To accomplish the above objects and other advantages, embodiments of the present invention provides a non-volatile memory device including two memory cells isolated by a non-charge trapping layer on a channel region between two junction regions formed in a substrate. The two memory cells are symmetric, and each of the two memory cells includes a memory layer and a gate. The memory layer may include a tunnel oxide layer, a charge trap layer and a blocking insulating layer orderly stacked on the channel region.

By applying a proper voltage to the gate and the two junction regions of each memory cell, charges are injected into the charge trap layer from the channel region through the tunnel oxide layer (i.e., tunneling the tunnel oxide layer or jumping a potential barrier of the tunnel oxide layer), or in an opposite direction.

An embodiment of the memory array of the present invention includes a memory cell region having a plurality of unit memory cells arranged in a matrix configuration on a substrate. Each of the unit memory cells may also include a first memory cell and a second memory cell, where each unit memory cell may include a memory layer and a gate layer insulated from the memory layer by a non-charge trapping layer. Additionally, a predetermined number of the memory cells in a column direction are connected to form a respective memory string and the gates of the memory cells in a row direction form a respective word line.

This memory array embodiment of the present invention further includes a first selection transistor and a second selection transistor connected to the first and last memory cells of the memory string such that the first and second selection transistors are alternatively connected to the first memory cells in the row and the last memory cells in the row. Here, the gates of the first and second selection transistors connected to the first memory cells of the memory strings form a first selection line and the gates of the first and second selection transistors connected to the last memory cells form a second selection line.

Also included in this embodiment is a bit line connected to the first and second selection transistors of adjacent memory strings in the row. The bit line in the odd column is connected to the first and second selection transistors, which are connected to the first memory cells of the two adjacent memory strings, and the bit line in the even column is connected to the first and second selection transistors connected to the last memory cells of the two adjacent memory strings.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 7B is an equivalent circuit diagram of the non-volatile memory device illustrated in

FIG. 7A;

DETAILED DESCRIPTION

Figure 1A:
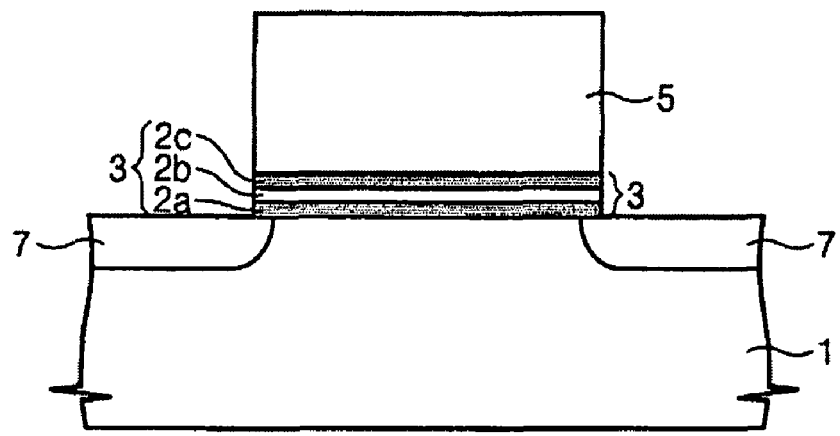
FIG. 1A is a schematic sectional view of a conventional non-volatile memory device.
Figure 1B:
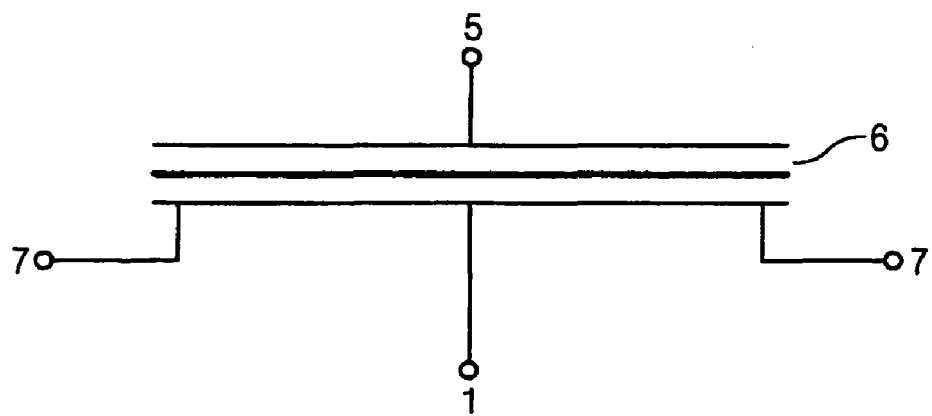
FIG. 1B is an equivalent circuit diagram of the non-volatile memory device illustrated in FIG. 1A.
Figure 2:
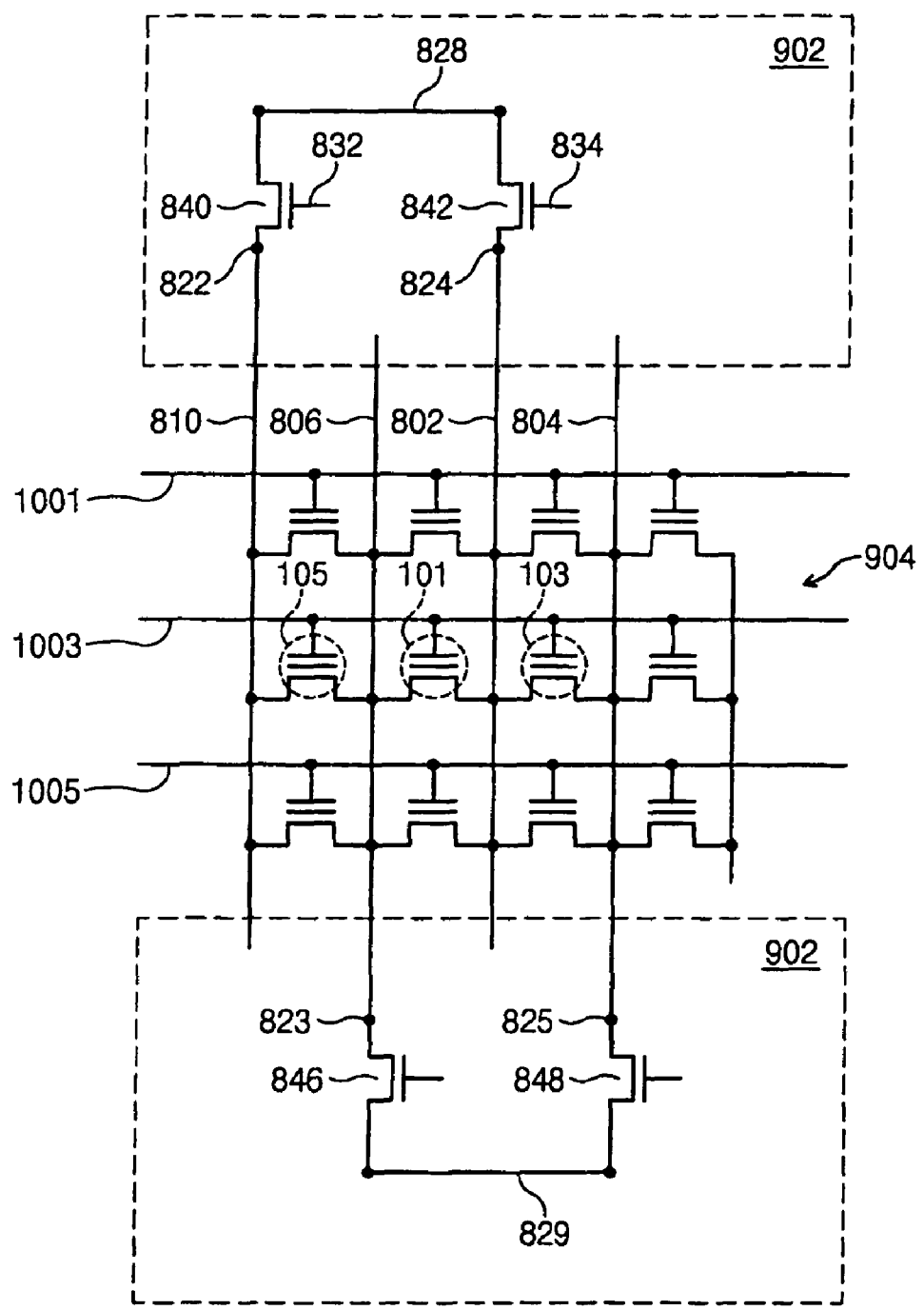
FIG. 2 is a schematic view of a conventional memory array architecture.
Figure 3A:
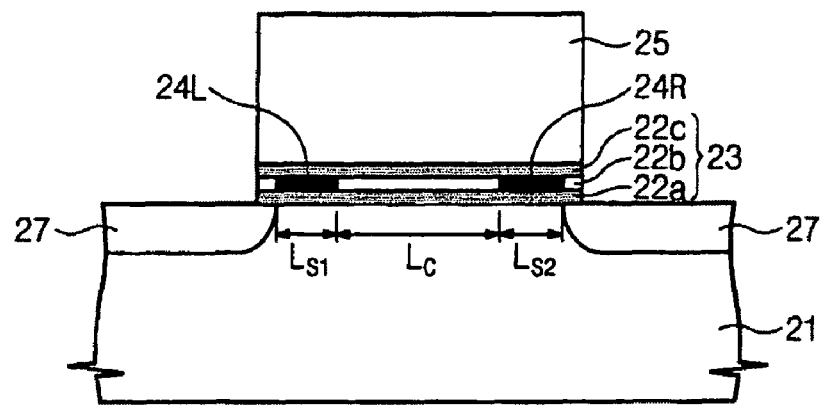
FIG. 3A is a sectional view schematically showing a conventional memory device.
Figure 3B:
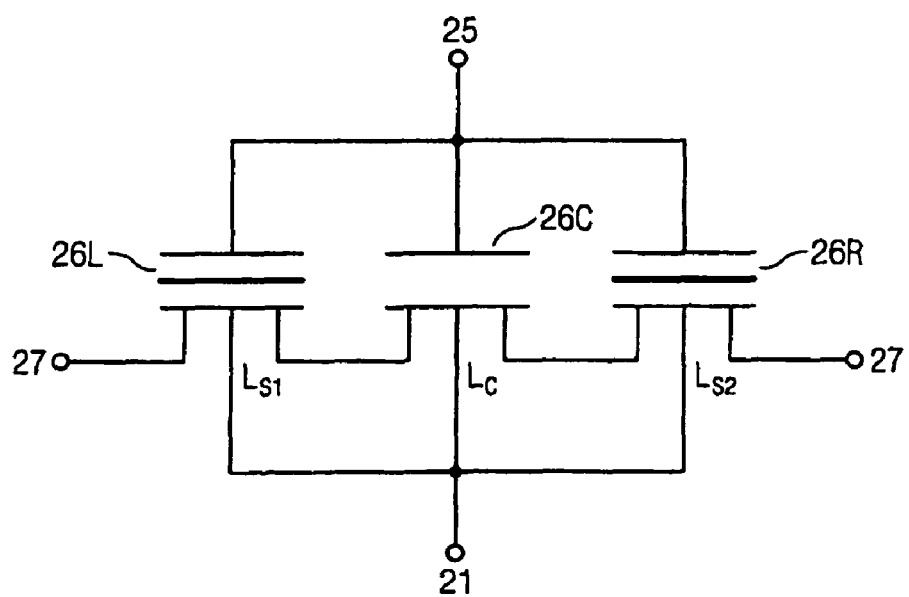
FIG. 3B is an equivalent circuit diagram of the non-volatile memory device illustrated in FIG. 3A.
Figure 4A:
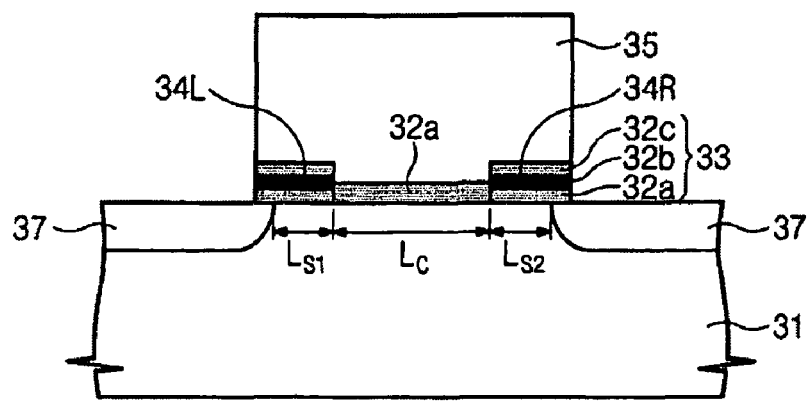
FIG. 4A is a sectional view schematically showing a conventional memory device.
Figure 4B:
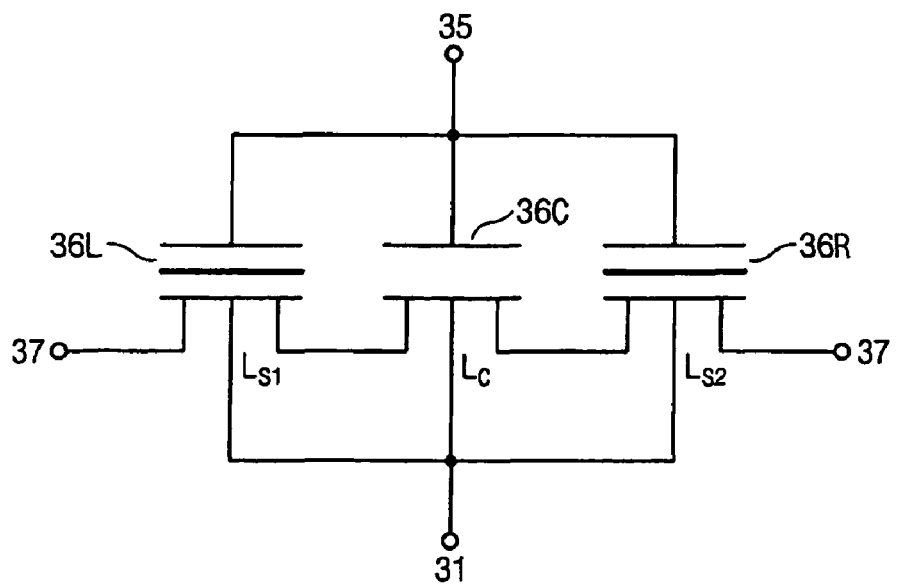
FIG. 4B is an equivalent circuit diagram of the non-volatile memory device illustrated in FIG. 4A.
Figure 5A:
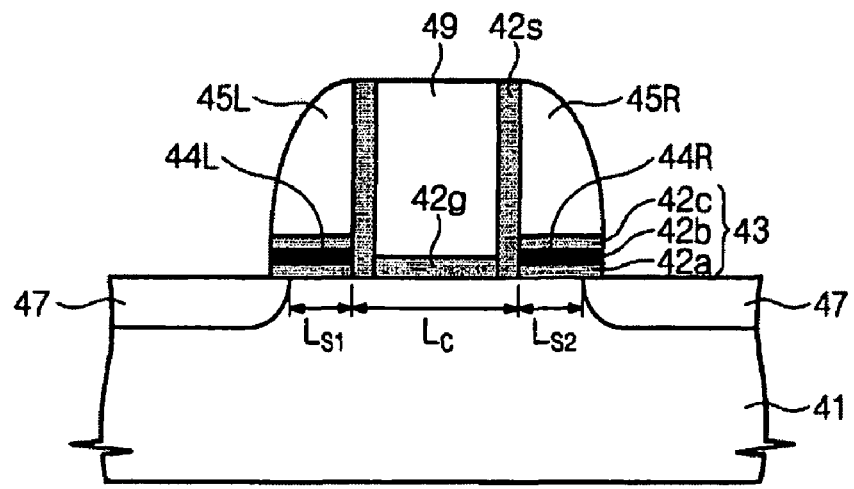
FIG. 5A is a sectional view schematically showing a conventional memory device.
Figure 5B:
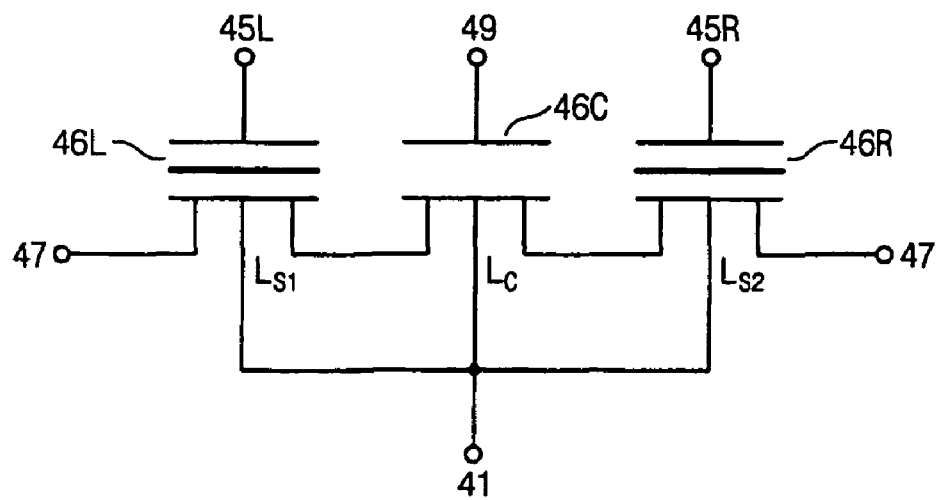
FIG. 5B is an equivalent circuit diagram of the non-volatile memory device illustrated in FIG. 5A.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Memory Device

First Embodiment

Figure 6A:
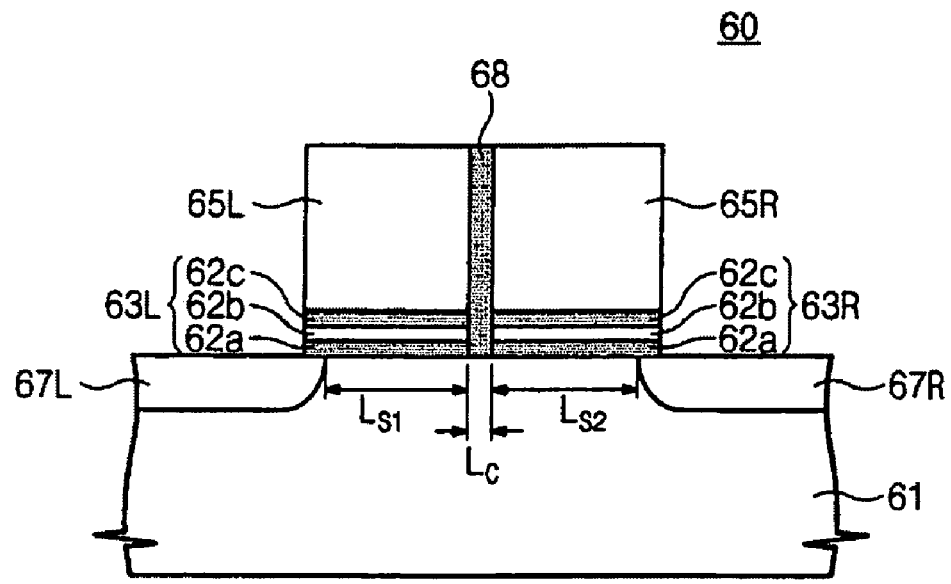
FIG. 6A is a sectional view schematically showing a memory device according to an embodiment of the present invention.
Figure 6B:
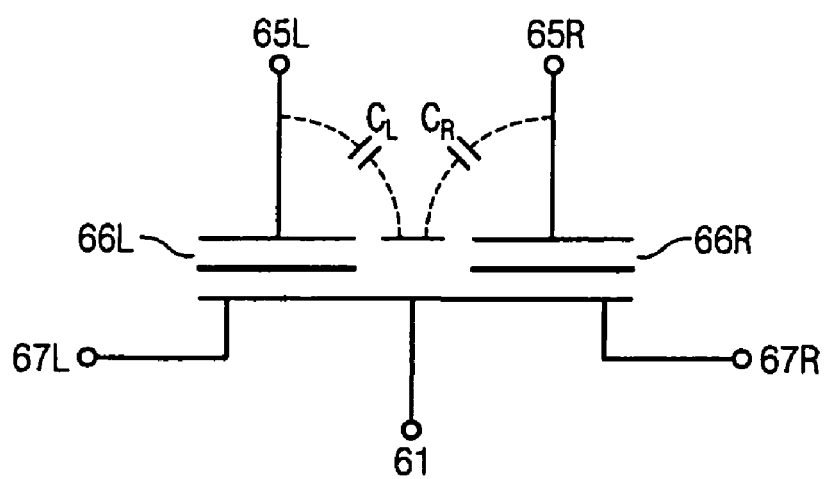
FIG. 6B is an equivalent circuit diagram of the non-volatile memory device illustrated in FIG. 6A.

FIG. 6A is a sectional view schematically showing a memory device 60 according to an embodiment of the present invention and FIG. 6B is an equivalent circuit diagram of the non-volatile memory device 60 illustrated in FIG. 6A.

Referring to FIGS. 6A and 6B, the non-volatile memory device 60 according to an embodiment of the present invention includes a substrate 61, two junction regions 67L and 67R formed apart from each other in the substrate 61, and two memory cells 66L and 66R formed on a channel region between the two junction regions 67L and 67R and separated by a non-charge trapping layer 68. Each memory cell 66L/66R includes a memory layer 63L/63R comprised of a plurality of layers, and a gate 65L/65R. Channel region Ls1 (that is first or left channel region) is defined below memory cell 66L (that is first or left memory cell), channel region Ls2 (that is second or right channel region) is defined below memory cell 66R (that is second or right memory cell), and channel region Lc (that is third or center channel region) is defined below the non-charge trapping layer 68. The left channel region Ls1 is controlled by the gate 65L of the left memory cell, the right channel region Ls2 is controlled by the gate 65R of the right memory cell 66R, and the center channel region Lc can be controlled by either the left gate 65L or the right gate 65R. In other words, the center channel region Lc is controlled by coupling capacitors CL and CR formed due to an influence of a fringe electrical field by the two gates 65L and 65R.

In accordance with the conductive types of the substrate 61 and the junction regions 67R and 67L, the memory cells 66L and 66R become an N-channel device or a P-channel device. For example, if the substrate 61 is a P-type and the junction regions 67L and 67R are an N-type, it is an N-channel memory device, whereas if the substrate 61 is an N-type and the junction regions 67L and 67R are a P-type, it is a P-channel memory device.

The memory cells 66L and 66R may be symmetric. For example, for the left memory cell 66L, the left junction region 67L may serve as a source and the right junction region 67R may serve as a drain. On the contrary, for the right memory cell 66R, the left junction region 67L may serve as a drain and the right junction region 67R may serve as a source. The junction regions 67L and 67R are formed by, in the case of an N-channel memory device, implanting arsenic (As) and in the case of a P-channel memory device, implanting boron (B) in a dose range of about $1\times10^{15}$ atoms/cm$^2$ to about $5\times10^{15}$ atoms/cm$^2$ in an energy range of about 30 keV to about 50 keV.

Each memory layer 63L/63R includes a tunnel oxide layer 62a, a charge trap layer 62b, and a blocking insulating layer 62c. Preferably, the charge trap layer 62b is a nitride layer. In addition to a nitride layer, the charge trap layer 62b may include insulators having a high charge trap density, such as an aluminum oxide ($Al_2O_3$), a hafnium oxide (HfO), a hafnium aluminum oxide (HfAlO), a hafnium silicon oxide (HfSiO) or the like, or a doped polysilicon, a metal, or nanocrystals of these materials.

The blocking insulating layer 62c is preferably an oxide layer. In addition to an oxide layer, the blocking insulating layer 62c may include insulators having a high permittivity, such as an aluminum oxide ($Al_2O_3$), a hafnium oxide (HfO), a hafnium aluminum oxide (HfA1O), a hafnium silicon oxide (HfSiO), or the like.

Preferably, the tunnel oxide layer 62a is, for example, a thermal oxide having a thickness range of about 35 to about 40 Å, the blocking insulating layer 62c is, for example, an oxide having a thickness range of about 100 to about 200 Å, and the charge trap layer 62b is, for example, a nitride layer having a thickness range of about 70 to about 150 Å. When a combination of bias voltages are applied to the junction regions 67L and 67R, the substrate 61 and the gates 65L and 65R, charges tunnel through the tunnel oxide layer 62a, i.e., charges tunnel through a potential barrier and are trapped in the charge trap layer 62b. Because of the low conductivity of the charge trap layer 62b, the charges trapped in the charge trap layer 62b are not moved or diffused. The blocking insulating layer 62c insulates the charge trap layer 62b and the gate 65L/65R from each other and prevents a transfer of the charges therebetween.

Thicknesses of the tunnel oxide layer 62a, the charge trap layer 62b, and the blocking insulating layer 62c forming the memory layer 63L/63R are properly selected depending on a bias condition and/or a wanted program/erase method.

When charges, for example, electrons, are injected into the charge trap layer 62b of the memory cell, it is preferable that the charges should not be accumulated in the non-charge trapping layer 68 interposed between the two memory cells 66L and 66R. For this purpose, the non-charge trapping layer 68 in the embodiments of the present invention is an insulating layer not having a trap region. When charges are accumulated in the non-charge trapping layer during a program operation, the programming efficiency may be lowered and the threshold voltage of the memory cell may be affected during a read operation. Also, an erase time for completely removing the charges accumulated in the non-charge trapping layer 68 may be increased during an erase operation. Preferably, the non-charge trapping layer 68 is a silicon oxide layer. Also, it is preferable that the non-charge trapping layer 68 be as thin as possible for a high integration. Preferably, the non-charge trapping layer 68 is thinner than the memory layer 63L/63R. Also, in order to enhance the controllability of the gate to the center channel region Lc, the non-charge trapping layer 68 between the memory layers 63L and 63R has a high permittivity, and the non-charge trapping layer between the gates 65L and 65R may have a low permittivity so as to decrease a coupling therebetween.

The gates 65L and 65R may be formed of, for example, an impurity-doped polysilicon, but the present invention is not particularly limited thereto. As described above, the memory device according to the present embodiment includes two gates 65L and 65R physically separated by the non-charge trapping layer 68, which does not have a charge trap site, between the two junction regions 67L and 67R, and the memory layers 63L and 63R having the charge trap layer 62b storing charges between each gate and the channel region of the substrate. Accordingly, a proper combination of voltages is applied to the two junction regions 67L and 67R and the gates 65L and 65R so that electrons and holes are selectively or wholly injected/emitted into the charge trap layer to vary the threshold voltage of the memory device.

Also, since the two memory cells are isolated by the thin non-charge trapping layer 68, a memory device having a high integration can be realized.

Second Embodiment

Figure 7A:
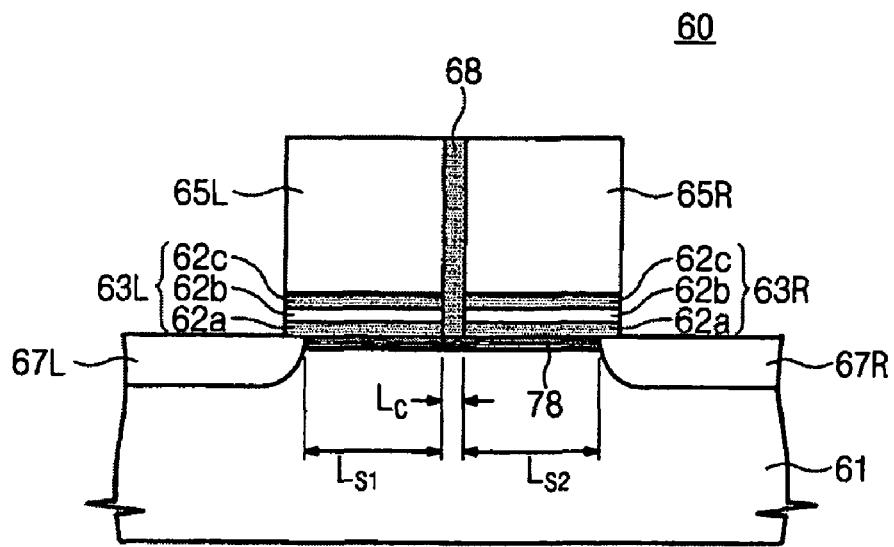
FIG. 7A is a sectional view schematically showing a memory device according to another embodiment of the present invention.
Figure 7B:
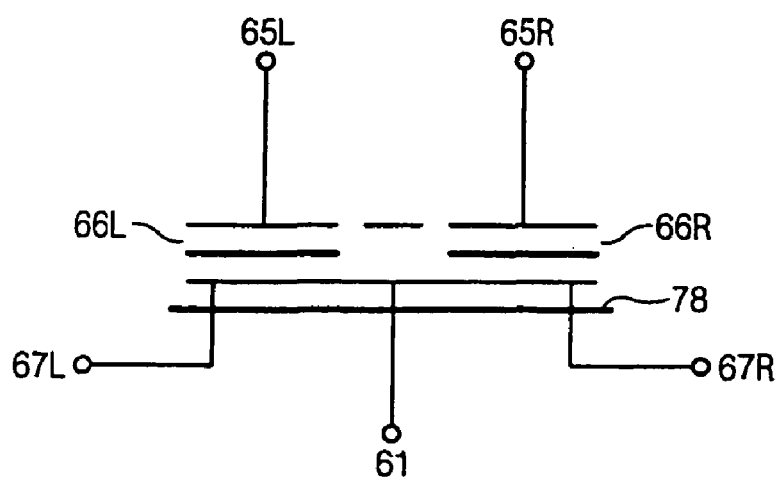

FIG. 7A is a sectional view schematically showing a memory device according to a second embodiment of the present invention, and FIG. 7B is an equivalent circuit diagram of the non-volatile memory device of FIG. 7A. Compared with that of the first embodiment described with reference to FIGS. 6A and 6B, the non-volatile memory device of the present embodiment further includes an impurity diffusion layer 78 having the same conductive type as that of the junction regions 67L and 67R in the channel region. According to the present embodiment, memory cells 66L and 66R may be a depletion type having a negative threshold voltage. The impurity diffusion layer 78 is formed by implanting P-type or N-type impurity ions into the substrate 61. A P-type channel is formed by implanting B in an energy range of about 30 to about 50 keV in a dose range of about $1\times10^{12}$ to about $1\times10^{13}$ atoms/cm$^2$, and N-type channel is formed by implanting As or phosphorous (P) in an energy range of about 30 to about 50 keV in a dose range of about $1\times10^{12}$ to about $1\times10^{13}$ atoms/cm$^2$. The dose of the impurity diffusion layer 78 may be determined such that impurity ions having an opposite conductive type to the substrate are implanted and accumulated in the channel region or the conductive type of the channel region is inverted. The impurity diffusion layer 78 is formed in a center channel region Lc below the non-charge trapping layer 68 as well as in channel regions Ls1 and Ls2 below the memory cells 66L and 66R. Accordingly, compared with the non-volatile memory device described with reference to FIGS. 6A and 6B, control the center channel region Lc may not necessarily be needed or may at least be easy, using the gate 65L/65R of each memory cell. The threshold voltage of each memory cell can be adjusted by properly engineering the work function of the gate. For example, by forming the gate of an impurity doped polysilicon and properly adjusting the concentration of the impurity, the work function can be adjusted. Also, by forming the gate of a polysilicon or a metallic multi-layer, it is possible to adjust the work function of the gate.

Third Embodiment

Figure 8A:
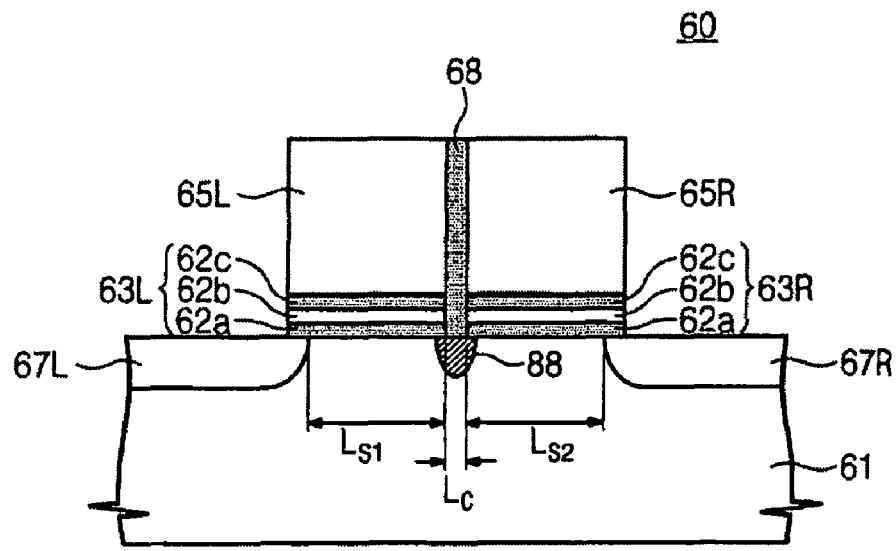
FIG. 8A is a sectional view schematically showing a memory device according to another embodiment of the present invention.
Figure 8B:
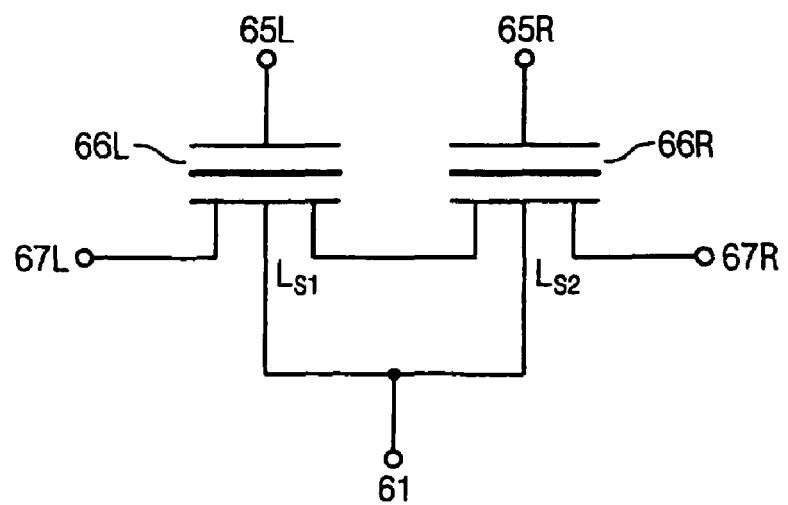
FIG. 8B is an equivalent circuit diagram of the non-volatile memory device illustrated in FIG. 8A.

FIG. 8A is a sectional view schematically showing a memory device according to a third embodiment of the present invention, and FIG. 8B is an equivalent circuit diagram of the non-volatile memory device of FIG. 8A. Compared with that of the first embodiment described with reference to FIGS. 6A and 6B, the non-volatile memory device of the present embodiment further includes an impurity diffusion layer 88 at a center channel region Lc below the non-charge trapping layer 68. The impurity diffusion layer 88 is formed by implanting impurity ions having the same conductive type as that of the junction regions 67L and 67R into the substrate 61. Accordingly, like the non-volatile memory device described with reference to FIGS. 7A and 7B, control the center channel region Lc may not necessarily be needed or at least be easy, using the gate 65L/65R of each memory cell.

The impurity diffusion region 88 is formed relatively narrower than the junction regions 67L and 67R. Also, the impurity diffusion region 88 has a relatively lower concentration than the junction regions 67L and 67R. For example, in the case of N-type channel, the impurity diffusion region 88 is formed by implanting As in an energy range of about 10 to about 30 keV in a dose range of about $5 \times 10^{14}$ to about $1 \times 10^{15}$ atoms/cm$^2$, and in the case of P-type channel, the impurity diffusion region is formed by implanting B in an energy range of about 10 to about 30 keV in a dose range of about $5 \times 10^{14}$ to about $1 \times 10^{15}$ atoms/cm$^2$.

Memory Erase Operation

Program/Erase Operation

The program of the memory device in the several embodiments of the present invention described above may indicate that electrons are injected into the charge trap layer of a memory cell. On the contrary, the erase may indicate that electrons are emitted from the charge trap layer to the channel region. Meanwhile, in the case of hole, program and erase may indicate an opposite direction of charges as compared with electrons. Also, the program may indicate increasing the threshold voltage of a memory cell, and the erase may indicate decreasing the threshold voltage of a memory cell. Additionally, the programmed memory cell can be mentioned as a second state, and the erased memory cell can be mentioned as a first state. Although having different values, it is assumed that the threshold voltage of the programmed memory cell (memory cell of a second state) is, for example, about 3 V, and the threshold voltage of the erased memory cell (memory cell of a first state) is, for example, about −3 V.

According to the several embodiments of the present invention, since the respective memory cells 66L and 66R are physically insulated from each other by the non-charge trapping layer 68, each memory cell can be independently programmed or erased by properly selecting the voltages applied to the gates, the junction regions, and the substrate. In other words, any one of the two memory cells may be selectively programmed/erased or both of the two memory cells may be programmed/erased, or both of the two memory cells may not be programmed/erased.

For example, in a memory device, where a ground voltage is applied to the substrate and one of the junction regions, a control voltage is applied to the other junction region, a first high voltage is applied to a gate of a memory cell adjacent to the junction region to which the control voltage is applied, and a second high voltage lower than the first high voltage is applied to a gate of a memory cell adjacent to the junction region to which the ground voltage is applied, hot electrons are injected into the charge trap layer of the memory cell to which the first high voltage is applied, by a channel-hot-electron injection.

The second high voltage allows a channel to be formed below the memory cell adjacent to the junction region to which the ground voltage is applied (i.e., allows a channel to be formed and thus current to flow), and the first high voltage allows hot electrons to be generated around the junction region to which the control voltage is applied and to be injected into the charge trap layer. The control voltage is to apply a fringe electrical field between the two junction regions. The control voltage may be, for example, about 3.5 to about 5.5 V. The first high voltage may be, for example, about 4.5 to about 6.5 V and the second high voltage may be, for example, about 3 to about 4.5 V.

In the above memory device, when the ground voltage is applied to the two junction regions and the semiconductor substrate, a first program/erase voltage is applied to a gate of any of the memory cells, a ground voltage or a second program/erase voltage lower than the first program voltage is applied to a gate of the other memory cell, electrons are injected by a tunneling from the channel region of the semiconductor substrate to the charge trap layer of the memory cell to which the program/erase voltage is applied or emitted from the charge trap layer to the channel region. Herein, when the tunnel oxide layer has a thickness of less than about 30 Å, a direct tunneling mainly occurs, whereas when the tunnel oxide layer has a thickness of more than about 30 Å, Fauler-Nordheim tunneling mainly occurs.

For example, if the program/erase voltage and the program/erase preventing voltage have a positive value, electrons pass through the tunnel oxide layer from the channel region of the semiconductor substrate and are then injected into the charge trap layer of the memory cell to which the program/erase voltage is applied. At this time, holes will move in an opposite direction to the electrons. On the contrary, if the program/erase voltage and the program/erase preventing voltage has a negative value, electrons pass through the tunnel oxide layer from the charge trap layer of the memory cell to which the program/erase voltage is applied and are then emitted to the channel region of the semiconductor substrate. At this time, holes will move in an opposite direction to the electrons.

The program/erase voltage has a sufficiently high voltage, for example, about 15 V such that the electrons of the channel region can pass through the tunnel oxide layer. The program/erase preventing voltage is applied so as to prevent the memory cell to which the program/erase preventing voltage is applied from being programmed or erased, and has a voltage lower than the program/erase voltage, for example, a ground voltage (about 0 V) or about 0.4 to about 0.5 V. Meanwhile, when the program/erase voltage is applied to all the gates of the two memory cells, charge transfer occurs simultaneously in the two memory cells.

In the above memory device, when the ground voltage is applied to the substrate and one of the junction regions, a positive first high voltage is applied to the other junction region, a negative second high voltage is applied to the gate of the memory cell adjacent to the junction region to which the ground voltage is applied, and the ground voltage is applied to the gate of the memory cell adjacent to the junction region to which the ground voltage is applied, hot holes generated in the junction region to which the first high voltage is applied in the band-to-band-tunneling are injected into the trap layer of the memory cell to which the second high voltage is applied.

Hot holes are generated in the junction region to which the positive first high voltage is applied and overlaps the gate to which the negative second high voltage is applied, and some of the generated hot holes are injected into the charge trap layer by an electrical field generated by the negative second high voltage applied to the gate. For example, the positive first high voltage may be about 3.5 to about 5.5 V and the negative second high voltage may be about −3 V to about −1 V. Herein, if the negative second high voltage is applied to the gates of the two memory cells and the positive first high voltage is applied to the two junction regions, hot holes are generated in the two junction regions and are then injected into the charge trap layer of the two memory cells.

When electrons are injected into the charge trap layer (e.g., program state or second state), the threshold voltage of the memory cell increases, whereas when electrons are emitted from the charge trap layer (e.g., erase state or first state), the threshold voltage decreases. For example, the threshold voltage of the memory cell in the program state can be set to about 3 V and the threshold voltage in the erase state can be set to about −3 V.

Read Operation

Next, read operation of the memory device of the present invention will be described. A ground voltage is applied to one of the junction regions (adjacent to a selected memory cell), a read voltage $V_{read}$, which is higher than the ground voltage, is applied to the other junction region (adjacent to non-selected memory cell), a first control voltage having a value between the threshold voltage of the first state and the threshold voltage of the second state is applied to the gate of the memory cell adjacent to the junction region to which the ground voltage is applied, a second control voltage having a higher value than the threshold voltage of the first state and the threshold voltage of the second state is applied to the gate of the memory cell adjacent to the junction region to which the read voltage $V_{read}$ is applied, and the ground voltage or a positive low voltage greater than the ground voltage is applied to the semiconductor substrate. Accordingly, the channel between the two junction regions becomes a state (low resistance state) where current flows well or a state (high resistance state) where current does not flow well.

Again referring to FIGS. 6A and 6B, in order to read the left memory cell 66L, it is necessary to form a channel below the right memory cell 66R (inversely, in order to read the right memory cell 66R, it is necessary to form a channel below the left memory cell 66L). In order to form the channel below the right memory cell 66R, a voltage of about 2 to about 4 V, preferably, about 4 V is applied to the right gate 65L and a voltage of about 0.5 to about 1.5 V, preferably, about 1 V is applied to the right junction region 67R. In order to read the left memory cell 66L, a ground voltage is applied to the gate 65L of the left memory cell 66L and the left junction region 67L, and a ground voltage or a positive low voltage, for example, about 0.3 to about 0.6 V (preferably, about 0.4 to about 0.5 V) is applied to the substrate 61.

By having a voltage of about 4 V applied to the right gate 65R of the right memory cell 66R having a threshold voltage of about 3 V, a channel is formed below the right memory cell 66R and a channel is also formed below the non-charge trapping layer 68. On the other hand, since a ground voltage is applied to the left gate 65L of the left memory cell 66L having a threshold voltage of about 3 V, a channel is not formed below the left memory cell 66L. In other words, a channel extending between the two junction regions 67L and 67R is not formed but a discrete channel is formed. Accordingly, the discrete channel region between the two junction regions 67L and 67R may be in a high resistance state through which current does not flow well. Here, it is important and noted that about 0 V should be applied to the junction region 67L adjacent to the selected memory cell 66L and a higher voltage should be applied to the junction region 67R adjacent to the non-selected memory cell 66R. This is to reduce a short channel effect by minimizing the voltage applied to the junction region of the memory device to suppress the drain induced barrier lowering (DIBL) as much as possible because the memory device has a short channel. Also, when a positive low voltage is applied to the substrate 61, the width of a depletion region between the substrate 61 and the junction region is reduced, so that the short channel effect is further improved.

Herein, to read the right memory cell 66R, the voltages applied to the left gate 65L and the left junction region 67L should be exchanged with the voltages applied to the right gate 65R and the right junction region 67R. In other words, a ground voltage is applied to the right gate 65R and the right junction region 67R, about 2 volts to about 6 volts (preferably, about 4 volts) is applied to the left gate 65L, and about 0.5 volts to about 1.5 volts (preferably, about 1 volt) is applied to the left junction region 67L. In this case, a channel is formed below the left memory cell 66L but is not formed below the right memory cell 66R.

An actual memory array for applying the memory devices of the present invention shown in FIGS. 6A through 8A may have a variety of architectures depending on types of the memory devices. Hereinafter, in an exemplary aspect of the present invention, a memory array for a NAND flash memory device will be described.

Memory Array

First Memory Array Architecture

Figure 9:
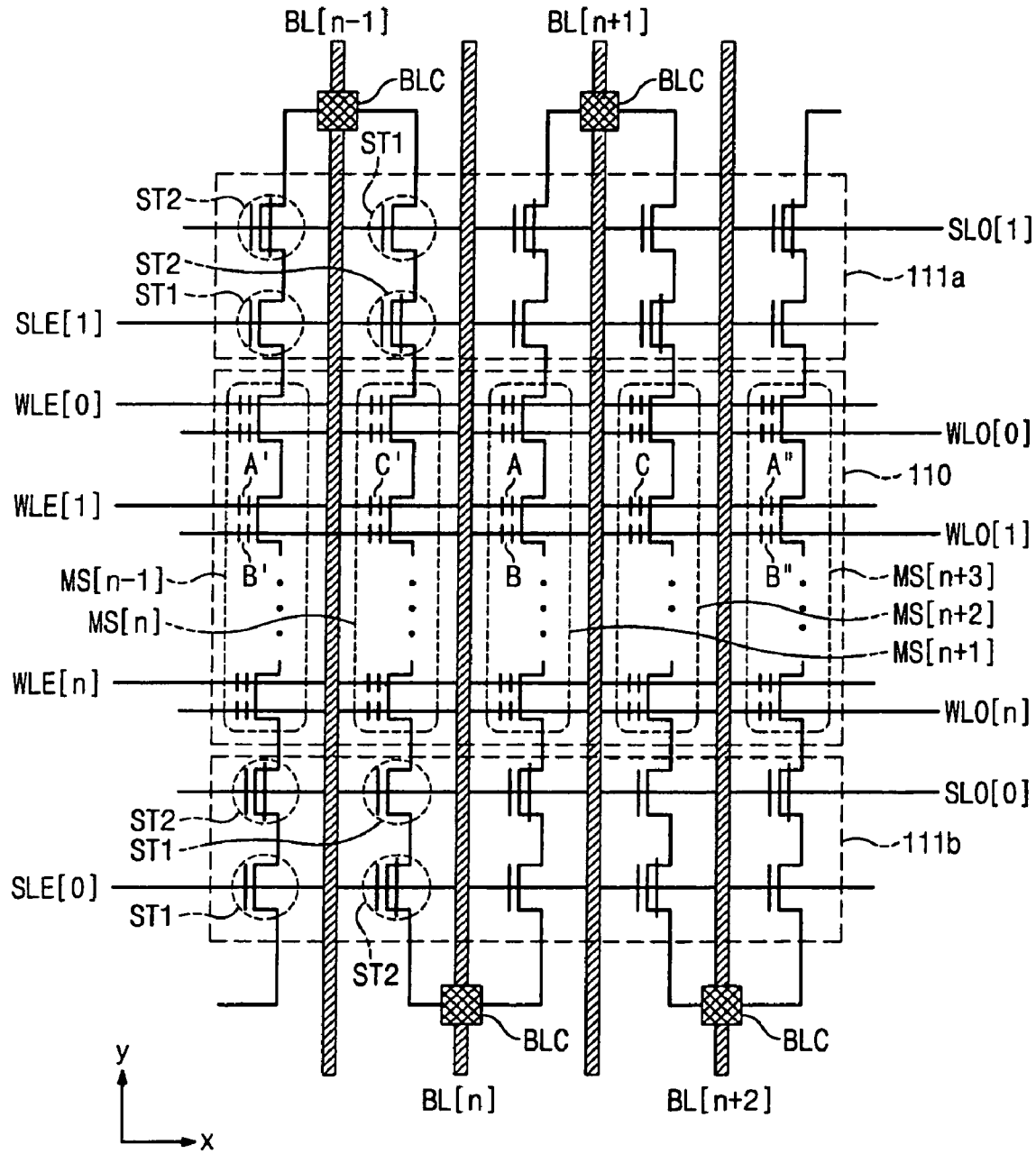
FIG. 9 is an illustration of a memory array architecture according to an embodiment of the present invention.

FIG. 9 is an illustration of a memory array architecture according to an embodiment of the present invention. Referring to FIG. 9, the memory array architecture of the present invention includes a memory region 110 where a plurality of unit memory cells are arranged in a matrix configuration, and selection transistor regions 111a and 111b disposed above and below the memory region 110 and having a plurality of selection transistors formed therein. Bit lines are connected to the plurality of memory cells through the selection transistors.

A predetermined number of unit memory cells (e.g., 16 unit memory cells) are connected in a column direction (i.e., y-axis direction) to form a single memory string. FIG. 9 shows an example of five memory strings (MS[n−1], MS[n], MS[n+1], MS[n+2], MS[n+3]). Memory cells in the same row direction (i.e., x-axis direction) are controlled by the same word line. In other words, the gates of the memory cells in the same row direction form the word line.

In the memory array of FIG. 9, the unit memory cell of the memory region 110 shows the memory cell structure shown in FIGS. 6A through 8A, but is not limited thereto. In other words, the unit memory cell includes two memory cells which are divided by the non-charge trapping layer and independently controlled. In the memory array of FIG. 9, the unit memory cell forming the memory region may be a single bit non-volatile memory device.

Each of the memory strings has four selection transistors. Among the four selection transistors, two selection transistors ST1 and ST2 are connected in series to the first memory cell which is at one end of the memory string, and the remaining two selection transistors ST2 and ST1 are connected in series to the last memory cell which is at the other end of the memory string. The selection transistors ST1 and ST2 in the same row direction are controlled by the same selection line. In other words, the gates of the selection transistors in the same row form the selection line. FIG. 9 shows four selection lines SLO[1], SLE[0], SLO[0], and SLE[0]. In the below description, SLE[1] is mentioned as upper first selection line, SLO[1] as upper second selection line, SLE[0] as lower first selection line, and SLO[0] as lower second selection line, respectively.

Herein, it is noted that the four selection transistors are classified into the two first selection transistors ST1 having a first threshold voltage and the two second selection transistors ST2 having a second threshold voltage. Also, in one memory string, in the first memory cell, the first selection transistor ST1 and the second selection transistor ST2 are connected in the order named, and in the last memory cell, the second selection transistor ST2 and the first selection transistor ST1 are connected in the order named. Between the adjacent memory strings, the connection order of the first and second selection transistors is changed in an inverse order. For example, in the first memory cell of the memory string MS[n−1], selection transistors are connected in the order of the first selection transistor ST1 and the second selection transistor ST2, and in the first memory cell of the memory string MS[n] adjacent to the memory string MS[n−1], selection transistors are connected in the order of the second selection transistor ST2 and the first selection transistor ST1. Accordingly, in each of the selection lines, the first selection transistor and the second selection transistor having different threshold voltages in the row direction are alternatively connected.

FIG. 9 also shows four bit lines BL[n−1], BL[n], BL[n+1], and BL[n+2]. Each of the bit lines is connected to the first selection transistor ST1 and the second selection transistor ST2 adjacent in the row direction through a bit line contact BLC. The junction regions (e.g., drains) of the two selection transistors adjacent in the row direction and having different threshold voltages are electrically connected through a connection means, such as a contact pad, and the bit lines are connected to the contact pad through the bit line contact BLC. The bit line contacts BLCs are alternatively formed above and below the memory region 110. In other words, the bit line BL[n−1] is connected to the second selection transistor ST2, which is connected to the first memory cell of the memory string MS[n−1] through the first selection transistor ST1, and the first selection transistor ST1, which is connected to the first memory cell of the memory string MS[n] through the second selection transistor ST2, and the bit line BL[n] is connected to the second selection transistor ST2, which is connected to the last memory cell of the memory string MS[n] through the first selection transistor ST1, and the first selection transistor ST1, which is connected to the last memory cell of the memory string MS[n+1] through the second selection transistor ST2. In the long run, the memory cells of both ends of the memory string are connected to two bit lines belonging to different columns. For example, the bit line BL[n−1] is connected to the first memory cell of one end of the memory string MS[n], and the bit line BL[n] is connected to the last memory cell corresponding to the other end of the memory string MS[n].

Therefore, according to the memory array architecture of the present embodiment, the source side and the drain side of the memory string are varied depending on whether the two bit lines adjacent to both ends of any of the memory strings are connected and the relative size of the voltages applied to the adjacent two bit lines. For example, one end of the memory string connected to the bit line to which a relatively higher voltage is applied may be the drain side and the other end of the memory string connected to the bit line to which a relatively lower voltage is applied may be the source side. Meanwhile, since the bit line is connected to one end of the memory string but is not connected to the other end of the memory string, the other end of the memory string can be floated. At this time, when a positive voltage is applied to the bit line connected to the one end, the one end may be the drain side, and when about 0 volts is applied to the bit line connected to the one end, the one end may be the source side.

According to the memory array of the present embodiment, two selection transistors having different threshold voltages are alternatively connected to both the first memory cell and the last memory cell of each memory string, and are connected in a reverse order between the adjacent memory strings. Accordingly, when a proper bias voltage is applied to the selection lines such that all the selection transistors connected to a specific memory string to be selected are switched on, only the specific memory string for the selection in a read operation is selected and both ends of the memory string adjacent to the selected specific memory string are not simultaneously connected to two bit lines. The read operation will be described later in more detail.

In the case of a NAND flash memory to which the memory device of the present invention is usefully applied, a plurality of memory strings can be selected simultaneously at one time. For example, the program/erase operation and the read operation can be simultaneously performed with respect to the memory strings in an odd column (or an even column). When the memory strings in the odd column are selected by the selection transistors having different threshold voltages, the memory strings in the even column are not selected. Further, an erase operation for all the strings of a specific block can be simultaneously performed. The erase operation will be described later in more detail.

Also, when the connection state of two bit lines and the size of voltages applied to the two bit lines are properly selected by a combination of voltages applied to the selection lines connected to both ends of the memory string, it is possible to selectively program only a specific memory cell (or cells) without intervening with the adjacent memory cells. The program operation will be described later in more detail.

The threshold voltages of the first and second selection transistors ST1 and ST2 can be properly set by the ion implantation process, the work function manipulation, and the like. The threshold voltage of the first selection transistor ST1 may have a different polarity than that of the second selection transistor ST2. For example, the first selection transistor may have a positive threshold voltage, for example, about 1 volt, and the second selection transistor may have a negative threshold voltage, for example, about −1 volt. At this time, a bias voltage for turning on the first selection transistor may be more than about 1 volt, for example, about 1 volt to about 3 volts, and a bias voltage for turning on the second selection transistor may be more than about −1 volt and less than about 1 volt, for example, about 0 volts.

Operation for the First Memory Array

In the operation of the memory array of FIG. 9, a combination of voltages applied to the word lines, the selection lines, and the bit lines is properly determined to meet the operation condition of the aforementioned memory device.

For example, in the memory array of FIG. 9, voltages applied to the word lines, selection transistors, and bit lines for the operations of the memory cells A, B, and C, i.e., read operation, program operation, and erase operation will be summarized as shown in the following table 1.

TABLE 1

| | WLE[0] | WLO[0] | WLE[1] | WLO[1] | WLE[n] | WLO[n] | BL[n] | BL[n+1] | BL[n+2] | SLE[0] SLE[1] | SLO[0] SLO[1] |
|---|---|---|---|---|---|---|---|---|---|---|---|
| Read A | Vr_pass | Vr_pass | Vsense | Vr_pass | Vr_pass | Vr_pass | Vpc | 0 V | Vpc | VDD VDD | 0 V 0 V |
| Read B | Vr_pass | Vr_pass | Vr_pass | Vsense | Vread | Vr_pass | 0 V | Vpc | 0 V | VDD VDD | 0 V 0 V |
| Read C | Vr_pass | Vr_pass | Vsense | Vr_pass | Vr_pass | Vr_pass | Vpc | 0 V | Vpc | 0 V 0 V | VDD VDD |
| Program A/ Inhibit | Vpass | Vpass | Vpgm | Vpass | Vpass | Vpass | VDD | 0 V/ VDD | VDD | 0 V VDD | VDD 0 V |
| Program B/ Inhibit | Vpass | Vpass | Vpgm | Vpass | Vpass | Vpass | 0 V/ VDD | VDD | 0 V | VDD 0 V | 0 V VDD |
| Program C/ Inhibit | Vpass | Vpass | Vpgm | Vpass | Vpass | Vpass | VDD | 0 V/ VDD | VDD | 0 V VDD | VDD 0 V |
| Erase | 0 V | 0 V | 0 V | 0 V | 0 V | 0 V | F | F | F | F | F |

Vr_pass = 5 V,
Vsense = 0 V,
Vpc = 1 V,
VDD = 1.8 V,
Vpass = 10 V,
Vpgm = 18 V,
F = Floating By applying proper voltages to the word lines, selection lines, and bit lines, the read and program operations in page units (512 bytes) are possible, and the erase operation in page units or block units (32 pages) is also possible. Alternatively, in a program having page units, it is also possible to allow a specific memory cell not to be programmed. For example, under a bias condition for the program of the memory cell 'A' of the above table 1, when VDD instead of 0V is applied to the bit line BL[n+1], the memory cell 'A' is not programmed.

Hereinafter, the memory array operation will be described in detail with reference to FIG. 9 and table 1.

Read Operation

Read operation in a NAND memory device may be performed in page units. For example, the read operation is simultaneously performed with respect to all the memory cells of odd memory string columns belonging to the word line of a specific row (or all the memory cells of even memory string columns).

In the memory array of FIG. 9, in order to perform a read operation of a specific memory cell (selection memory cell) of a specific memory string (selection memory string), the following steps are performed.

First, to apply a proper bias voltage for the read operation to the source side and the drain side of the selection memory string, it is necessary to turn on all the selection transistors connected to the selection memory string. For this purpose, a proper bias voltage is applied to the selection lines. For example, the same first selection voltage is applied to the upper first selection line SLE[1] and the lower first selection line SLE[0], and the same second selection voltage is applied to the upper second selection line SLO[1] and the lower second selection line SLO[0]. Here, when the first selection voltage applied to the first selection lines SLE[1] and SLE[0] is selected as a value greater than the threshold voltages of the two selection transistors ST1 and ST2, the second selection voltage applied to the second selection lines SLO[1] and SLO[0] is selected as a value between the threshold voltages of the two selection transistors ST1 and ST2. Or, in an opposite condition, the first selection voltage and the second selection voltage are selected. By the selection of selection voltages applied to the selection lines, both ends of specific memory strings, for example, the odd (or even) memory strings, are connected to two bit lines.

Secondly, to prevent non-selected memory cells other than the selected memory cell from hindering the read operation, it is necessary to apply a proper bias voltage (read pass voltage: Vr_pass) to the non-selected word lines other than a selected word line to which the selected memory cell is connected such that the non-selected memory cells are all turned on regardless of their states. For this purpose, the read pass voltage Vr_pass, which is higher than the threshold voltage of the memory cell in the first state and the threshold voltage of the memory cell in the second state, is applied to the non-selected word lines. For example, when the threshold voltage of the memory cell in the first state is about −3 volts and the threshold voltage of the memory cell in the second state is about 3 volts, the read pass voltage applied to the non-selected word lines is about 5 volts.

Thirdly, to read the information stored in the selected memory cell, it is necessary to apply a proper bias voltage (sense voltage: Vsense) to the selected word line. For this purpose, a bias voltage between the threshold voltage of the memory cell in the first state and the threshold voltage of the memory cell in the second state is applied. For example, when the threshold voltage of the memory cell in the first state is about −3 volts and the threshold voltage of the memory cell in the second state is about 3 volts, the sense voltage applied to the selected word line is about 0 volts. Accordingly, if the selected memory cell connected to the selected word line is in the second state, it will not be turned on, whereas if the selected memory cell is in the first state, it will be turned on.

Fourthly, it is necessary to apply a proper bias voltage to the bit line connected to the source side of the selected memory string and to apply a proper bias voltage to the bit line connected to the drain side of the selected memory string. For this purpose, a ground voltage is applied to the bit line of the source side and as a precharge voltage, a positive low voltage greater than the ground voltage, for example, about 1.8 volts, is applied to the bit line of the drain side. Accordingly, if the selected memory cell connected to the selected word line is in the second state, the selected memory cell will not be turned on and the precharge voltage of the bit line connected to the drain side will not be greatly varied. On the other hand, if the selected memory cell connected to the selected word line is in the first state, the selected memory cell will be turned on, so that the precharge voltage of the bit line of the drain side drops towards 0 volts.

Hereinafter, a procedure for reading out bit information stored in the odd memory cells A', A, and A" connected to the word line WLE[1] in FIG. 9 will be described as one example. A VDD voltage of about 1.8 volts is respectively applied to the lower first selection line SLE[0] and the first upper selection line SLE[1], and a ground voltage is respectively applied to the lower second selection line SLO[0] and the upper second selection line SLO[1]. Therefore, only the selection transistors connected to the odd memory strings MS[n−1], MS[n+1] and MS[n+3] to which the selected memory cells A', A, and A" belong are turned on. a ground voltage is applied to the bit lines BL[n−1] and BL[n+1] of the source side of the selected memory cells, and the precharge voltage Vpc of about 1 volt is applied to the bit lines BL[n] and BL[n+2] of the drain side of the selected memory cells to precharge the bit lines BL[n] and BL[n+2] of the drain side. A sense voltage Vsense having a voltage level between the threshold voltage (e.g., −3 volts) of the memory cell in the first state and the threshold voltage (e.g., 3 volts) of the memory cell in the second state, for example, about 0 volts is applied to the selected word line WLE[1] to which the selected memory cells A', A, and A" belong. A read pass voltage Vr_pass of approximately 4 volts to approximately 6 volts, which are higher than the threshold voltages of the memory cells in the first and second states, is applied to the remainder of the non-selected word lines such that the non-selected memory cells are turned on regardless of their states.

Therefore, depending on the information stored in the selected memory cells, a channel is formed or is not formed below the corresponding memory cells, i.e., current flows or does not flow. If the threshold voltage of the selected memory cells is higher than about 0 volts (second state), the current flowing through the memory cell is very small and is negligible, whereas if the threshold voltage is lower than about 0 volts (first state), a current of a few hundred nA to tens of mA flows, so that a voltage Vpc of about 1 volt precharged in the bit lines BL[n] and BL[n+2] of the drain side drops towards 0 volts. Accordingly, a page buffer circuit (not shown) connected to the bit lines BL[n] and BL[n+2] of the drain side detects the voltages of the bit lines BL[n] and BL[n+2] after an elapse of a set time and if the detected voltage drops below a few hundreds mV from the precharged voltage Vpc, it outputs logic '1' which is an erase state, and if the detected voltage does not drop below a few hundreds mV, it outputs logic '1' which is a program state.

Herein, it is noted that about 0 volts is applied to the bit lines BL[n−1] and BL[n+1] corresponding to terminals in the source direction of the selected memory cells A', A, and A" and the precharged voltage Vpc is applied to the bit lines BL[n] and BL[n+2] corresponding to terminals in the drain direction of the selected memory cells A', A, and A".

To perform a read operation for memory cells B', B, and B" connected to the word line WL[1], terminals in the source direction of the selected memory cells B', B, and B" become the bit lines BL[n] and BL[n+2] and the ground voltage is applied to the bit lines BL[n] and BL[n+2], and the drain terminals become the bit lines BL[n−1] and BL[n+1] and the precharge voltage Vpc is applied the bit lines BL[n−1] and BL[n+1]. In this case, a ground voltage is applied to the selected word line WLO[1], and a voltage of about 4 to about 6 volts is applied to the remainder (non-selected) of the word lines.

Thus, why the ground voltage is applied to the bit lines of the source side of the selected memory cells and the precharged voltage Vpc is applied to the bit lines of the drain side in the read operation is that because the gate channel of the memory cell has a short channel ranging from a few nanometers (nm) to a few tens of nanometers, the voltage applied to the junction region of the memory cell should be minimized to suppress the drain induced barrier lowering (DIBL) as much as possible, thereby decreasing the short channel effect. In the aforementioned read operation of the present invention, while the order which the voltages are applied to the word lines, the bit lines, and the selection lines may be variously selected, it is preferable that the voltages be applied in the order of the bit lines, the word lines, and the selection lines. In FIG. 6A, when the read pass voltage Vr_pass of, for example, about 5 volts, is applied to the left gate 65L corresponding to the non-selected word line, the voltage applied to the left gate 65L may be coupled with the right gate 65R corresponding to the selected word line separated by the non-charge trapping layer 68. Accordingly, if the voltage is first applied to the word line and then is applied to the selection line, the voltage coupled before the voltage is applied to the selection line can be discharged.

Program Operation

Like the read operation, the program operation can be carried out in page units. Also, in the program operation of page units, it is possible to allow a specific memory cell not to be programmed.

The programming uses F-N tunneling phenomenon, in which electrons are injected into the charge trap layer from the substrate through the tunnel oxide layer. For programming using the F-N tunneling, a high vertical electrical field of about 18 volts, for example, should be formed between the gate of the selected memory cell to be programmed and the channel region. On the contrary, such a high vertical electrical field should not be formed between gates of non-selected memory cells and the channel region. For this purpose, a programming method according to an embodiment of the present invention includes allowing the drain side of the selected string to which the selected memory cell belongs to be floated, allowing about 0 volts to be applied to the source side, allowing the source side of non-selected memory string to be floated, and allowing a VDD voltage of about 1.8 volts for the boosting of the channel region to be applied to the drain side. Accordingly, if the program pass voltage Vpass of about 10 volts is applied to the non-selected word line, the voltage of the channel region of non-selected memory string to which the VDD voltage of about 1.8 volts is applied is boosted up to a voltage level of more than a positive low voltage, for example, VDD−Vt (where Vt is a threshold voltage of the selected transistor) due to a boosting effect by a gate capacitor formed between the gate of the non-selected memory cell and the channel region. On the other hand, the channel region of the selected memory string is kept at about 0 volts. Accordingly, when a program voltage Vpgm of about 18 volts is applied to the selected word line, electrons are injected into the charge trap layers of the selected memory cells due to the F-N tunneling phenomenon by a high electrical field between the selected memory cell and the underlying channel region, so that the threshold voltage is increased. However, since the voltage of the channel region of the non-selected memory cells precharged to VDD−Vt increases to a voltage of more than VDD−Vt, a high electrical field is not formed between the non-selected memory cell and the channel region, and accordingly F-N tunneling does not occur.

An example programming operation for the memory cells A', A, and A" of the odd memory strings will now be described with reference to FIG. 9 and table 1.

About 0 volts is applied to the lower first selection line SLE[0] and VDD of about 1.8 volts is applied to the upper first selection line SLE[1] such that the bit lines BL[n−1] and BL[n+1] are connected to the source side, but the drain side is made to be in a floating state. VDD of about 1.8 volts is applied to the lower second selection line SLO[0] and about 0 volts is applied to the upper second selection line such that the bit lines BL[n] and BL[n+2] are connected to the drain side of non-selected memory cells C', C, and C", but the source side is made to be in a floating state. About 0 volts, which is a program bit line voltage, is applied to the bit lines BL[n−1] and BL[n+1] and VDD of about 1.8 volts, which are a program preventing bit line voltage, is applied to the bit lines BL[n] and BL[n+2].

If the program pass voltage Vpass of about 10 volts is applied to non-selected word lines, the channel region of the selected memory string to which the selected memory cell belongs is connected in a 0 volt state and the channel regions of the non-selected memory cells C', C, and C" are precharged to about VDD−Vt. If the program word line voltage Vpgm of about 18 volts is applied to the selected word line WLE[1], electrons are injected into the charge trap layer of the selected memory cells from the channel region due to F-N tunneling phenomenon by a high electrical field generated between the selected memory cells A', A, and A" and the channel region, so that the threshold voltage is increased. However, the voltage of the channel region of the non-selected memory cells C', C, and C" which is precharged to VDD−Vt is increased to a voltage of more than VDD−Vt due to the boosting effect by a gate capacitor formed between the gate of non-selected memory cell and the channel region, so that F-N tunneling does not occurs and accordingly they are not programmed.

In the programming operation for the above selected memory cells A', A, and A", if the VDD of about 1.8 volts is applied instead of about 0 volts, the memory cells A' and A" are programmed but the memory cell A is not programmed. Therefore, in programming a page unit, a selected memory cell can remain unprogrammed.

Erase Operation

The erase operation for the memory array of the present invention can occur in page units or in block units (32 pages) comprised of a plurality of pages.

The erase operation uses F-N tunneling. Referring to FIG. 9 and table 1, a ground voltage of about 0 volts is applied to all the word lines, all selection lines are floated, and a positive high voltage (e.g., about 18 volts) is applied to the substrate. By doing so, F-N tunneling phenomenon occurs, so that the electrons injected into the charge trap layer of the memory cells are emitted to the substrate. Or, holes are injected into the charge trap layer from the channel of the memory cell.

Plan View and Sectional View for Memory Array

Figure 10A:
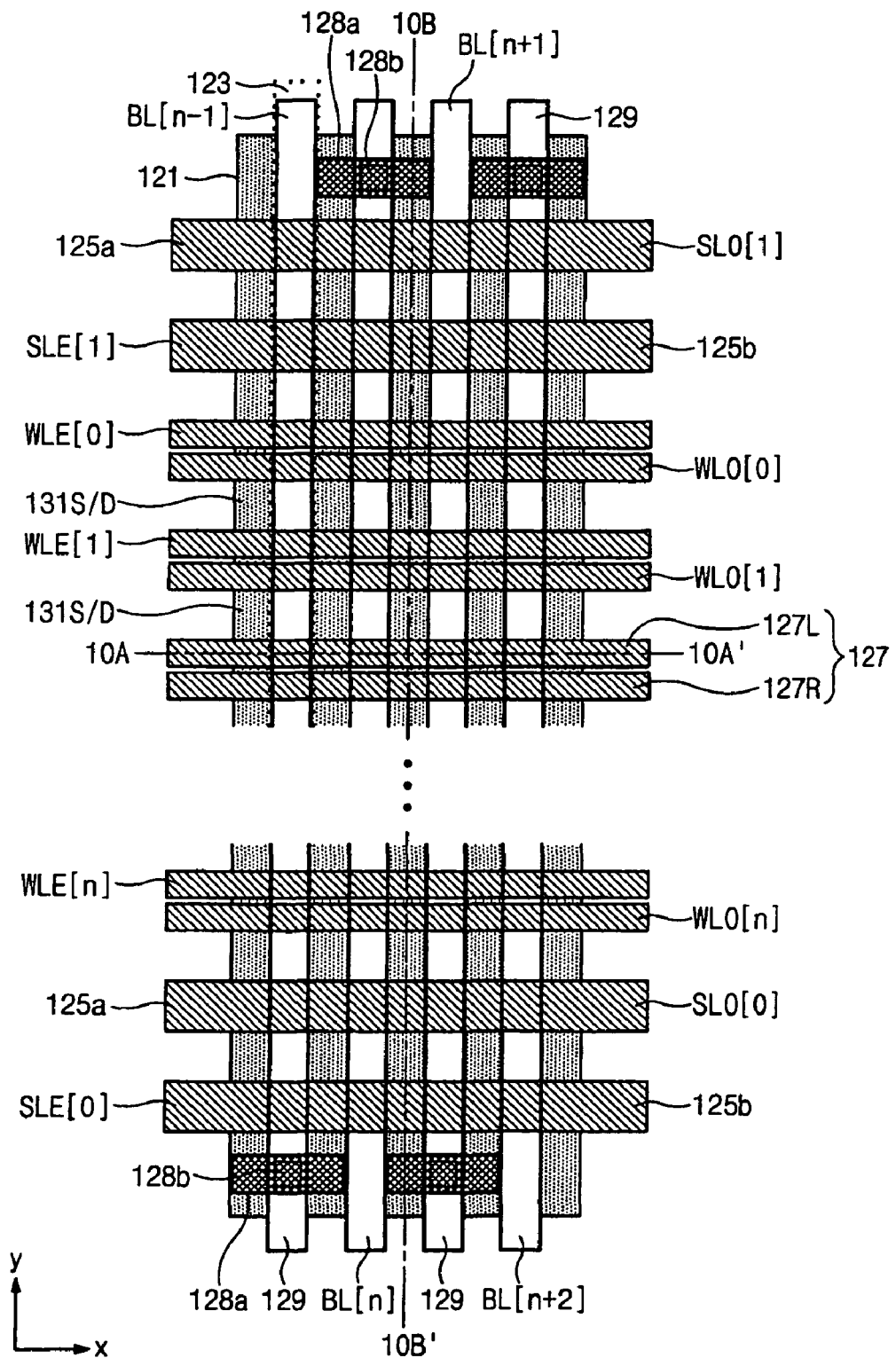
FIG. 10A is a plan view of the memory array architecture of FIG. 9.
Figure 10B:
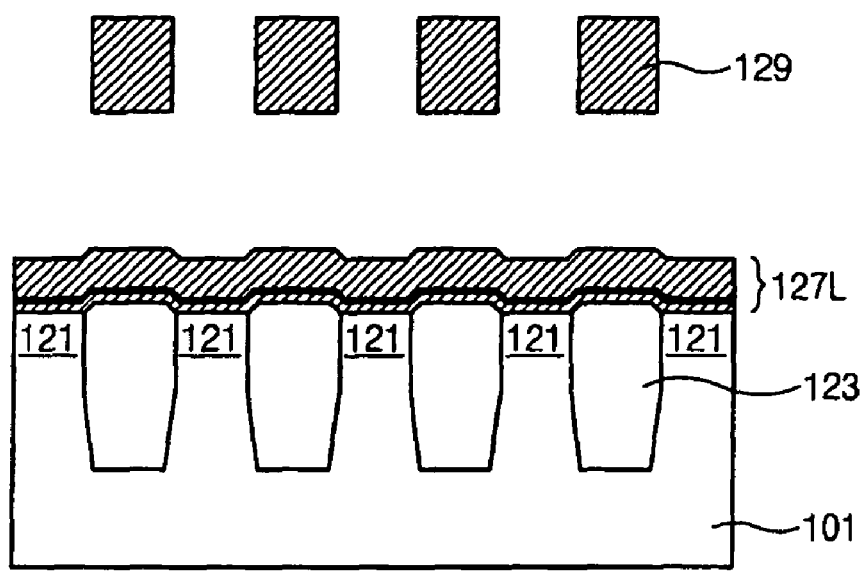
FIGS. 10B and 10C are sectional views taken along the lines 10A-10A' and 10B-10B' of FIG. 10A, respectively.
Figure 10C:
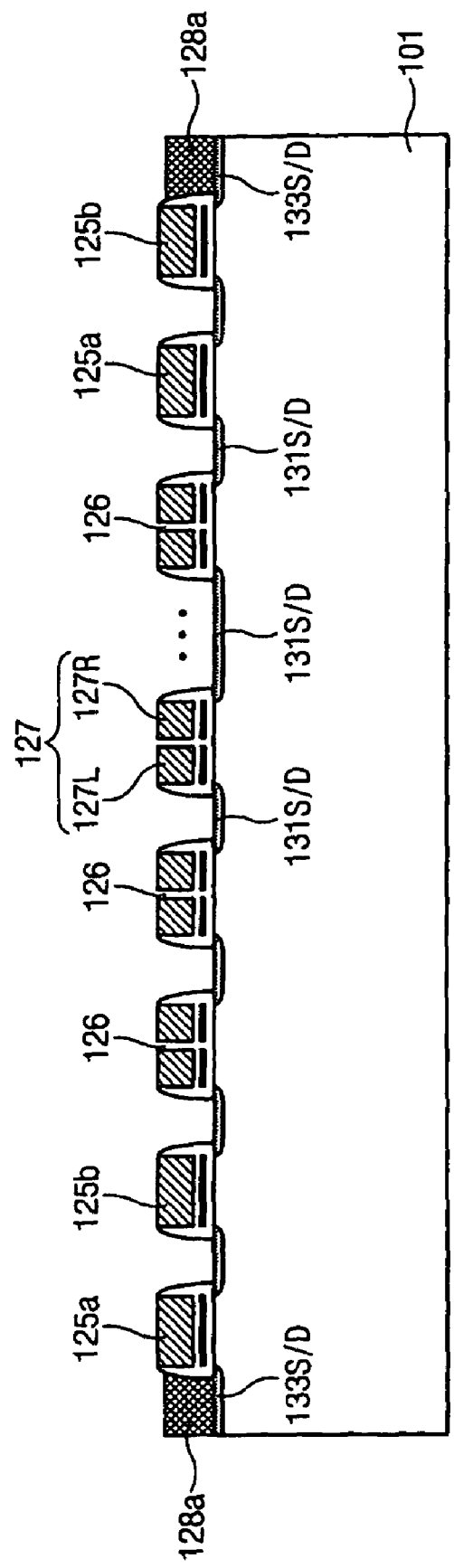

FIG. 10A is a plan view of the memory array architecture of FIG. 9, and FIGS. 10B and 10C are sectional views taken along the lines 10A-10A' and 10B-10B' of FIG. 10A, respectively.

Referring to FIGS. 10A through 10C, an active region 121 is defined in a substrate 101 by a device isolation region 123. Each device isolation region 123 is shaped in a bar extending in a column direction (y-axis), and an active region 121 extending in the column direction is defined between the device isolation regions 123. Word lines 127L and 127R and selection lines 125a and 125b cross the active region 121 and the device isolation region 123 and pass in a row direction (x-axis). Memory cells are positioned at sites where the word lines in the row direction cross the active regions in the column direction. Each memory cell includes a gate and an underlying memory layer, and the gate running in the row direction forms the word line. The memory layer includes a tunnel oxide layer, a charge trap layer, and a blocking insulating layer.

Two memory cells 127L and 127R isolated by a non-charge trapping layer 126 form a unit memory cell 127, and source/drain regions 131 S/D are positioned at both sides of the unit memory cell 127. Adjacent unit memory cells share source/drain regions 131S/D. A distance between adjacent unit memory cells 127 corresponds to a minimum line width 'F' (Shown in FIGS. 15-17). The width of the unit memory cell 127 is less than two times the minimum line width, i.e., 2*F, but it is more than the minimum line width 'F'. The width 'D' (Shown in FIGS. 15-17) of each word line constituting the unit memory cell is less than half the minimum line width (D<(1/2)*F). Accordingly, a memory array having a higher integration can be realized.

Meanwhile, a selection transistor is positioned at a site where the selection line in the row direction crosses the active region in the column direction. The gate of the selection transistor running in the row direction forms the selection line.

Source/drain regions 133S/D of two selection transistors adjacent in the column direction are connected to each other by a contact pad 128a.

The bit line 129 extends in the column direction and is disposed on the device isolation region 123. The bit line is connected to the contact pad 128a through the bit line contact 128b, so that the bit line is connected to two selection transistors which are adjacent in the column direction.

Second Memory Array Architecture

Figure 11:
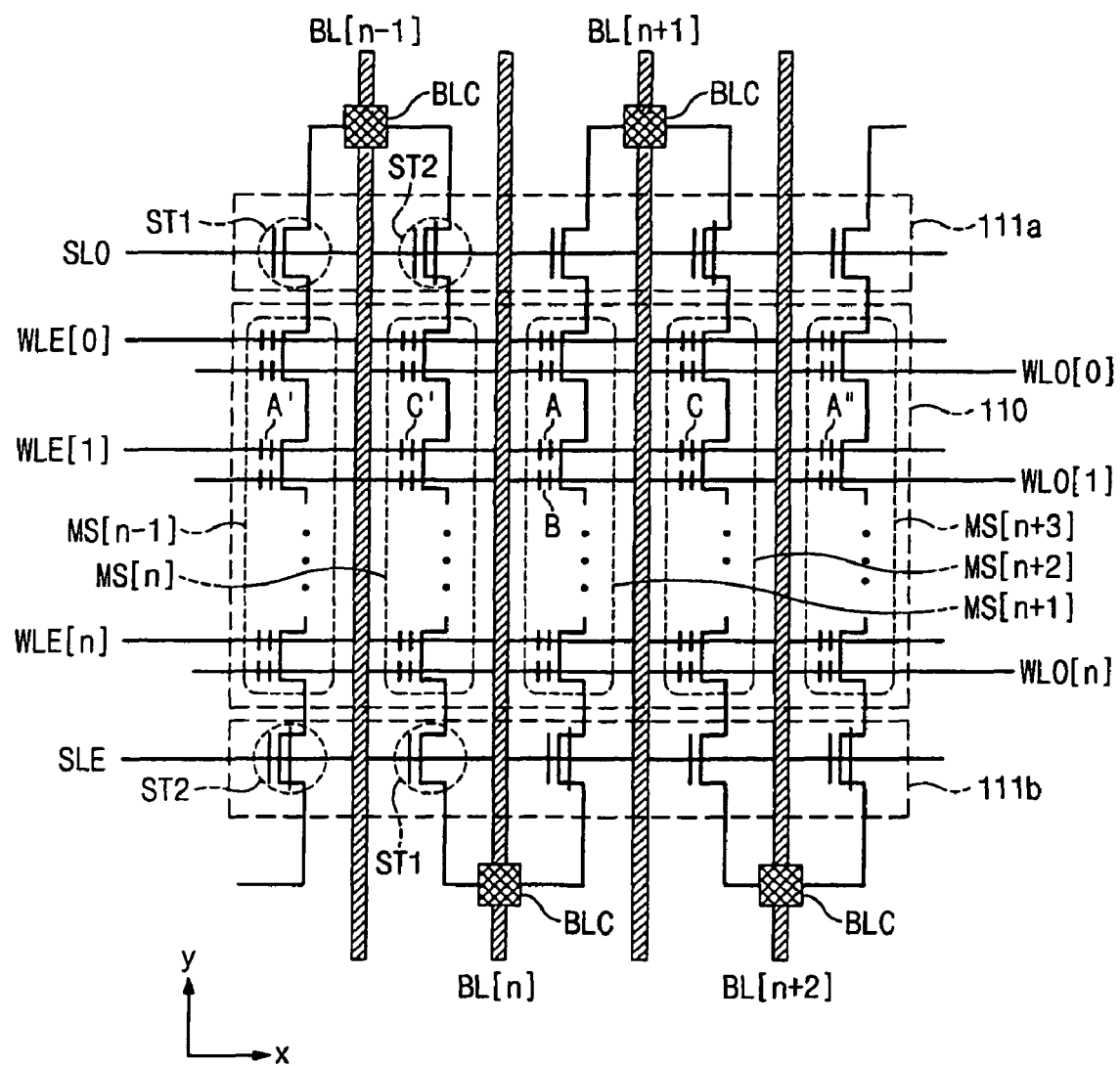
FIG. 11 is an illustration of a memory array architecture according to another embodiment of the present invention.

The memory array architecture shown in FIG. 9 includes four selection transistors disposed in one memory string. In order to reduce the effective memory cell size, four selection transistors may be replaced by two selection transistors. Such a memory array architecture is shown in FIG. 11. The memory array architecture of the present embodiment is the same as the memory array architecture described with reference to FIG. 9 except that each memory string includes two selection transistors having different threshold voltages. In the present embodiment, one of the two selection transistors, for example, a first selection transistor ST1 is connected to a first memory cell which corresponds to one end of the memory string, and the other, for example, a second selection transistor ST2, is connected to the last memory cell which corresponds to the other end of the memory string. The two selection transistors are alternatively connected to the first memory cell and the last memory cell of the memory string. Gates of the two selection transistors alternatively connected to the first memory cells in the row direction form a first selection line SLO and gates of the two selection transistors alternatively connected to the last memory cell form a second selection line SLE.

FIG. 11 exemplarily shows only five memory strings MS[n−1], MS[n], MS[n+1], MS[n+2], and MS[n+3] and four bit lines BL[n−1], BL[n], BL[n+1], and BL[n+2]. Each bit line is connected to the adjacent two selection transistors ST1 and ST2. In other words, the two selection transistors ST1 and ST2 adjacent in the row direction share a junction region (e.g., drain), and the bit line is electrically connected to the shared junction region through a bit line contact BLC. Each memory string is connected to two bit lines. That is, bit lines in different columns are connected to the first memory cell and the last memory cell of the memory string. For example, the threshold voltage of the first selection transistor ST1 is about 1 volt, and the threshold voltage of the second selection transistor ST2 is about 3 volts. At this time, a bias voltage for turning on the first selection transistor ST1 is above about 3 volts, a bias voltage for turning on the second selection transistor ST2 is greater than about 1 volt and smaller than about 3 volts, for example, about 1.5 volts. Accordingly, depending on a proper combination of voltages applied to the two selection lines SLE and SLO, both ends of a specific memory string are connected to two bit lines. When about 1.5 volts are applied to the selection line SLE and about 3 volts are applied to the selection line SLO, the memory string in an odd column is connected to the bit line. On the other hand, when about 3 volts are applied to the selection line SLE and about 1.5 volts are applied to the selection line SLO, the memory string in an even column is connected to the bit line.

Memory Array Operation

The operation of the memory array shown in FIG. 11 is the same as that of the memory array except that different voltages are applied to the two selection lines SLO and SLE. A proper voltage is applied such that a memory string to which the selected memory cells to be programmed or erased belong is selected.

In the memory array of FIG. 11, bias conditions according to operational types of memory cells A, B, and C are summarized in the following table 2.

to the bit lines BL[n−1] and BL[n+1] of the source side of the selected memory cells, and VDD voltage of about 1.8 volts, which are a program preventing bit line voltage, is applied to the bit lines BL[n] and BL[n+2] of the drain side.

If program pass voltage Vpass of about 10 volts is applied to the non-selected word lines, the channel region of the selected memory string to which the selected memory cell belongs is connected in a 0 volt state, and the channel regions of the non-selected memory cells are precharged to about VDD−Vt (Vt: threshold voltage of transistor), which is a positive low voltage higher than about 0 volts. If the program word line voltage Vpgm of about 18 volts is applied to the selected word line WLE[1], electrons are injected into the charge trap layer of the selected memory cells from the channel region due to F-N tunneling phenomenon by a high electrical field generated between the selected memory cells A', A, and A" and the channel region, so that the threshold voltage is increased. However, the voltage of the channel region of the non-selected memory cells C', C, and C", which is precharged to VDD−Vt is increased to a voltage of more than VDD−Vt due to the boosting effect by a gate capacitor formed between the gate of non-selected memory cell and the channel region, so that F-N tunneling does not occurs and accordingly they are not programmed.

TABLE 2

| | WLE [0] | WLO [0] | WLE [1] | WLO [1] | WLE [n] | WLO [n] | BL [n] | BL [n + 1] | BL [n + 2] | SLE | SLO |
|---|---|---|---|---|---|---|---|---|---|---|---|
| Read A | Vr_pass | Vr_pass | Vsense | Vr_pass | Vr_pass | Vr_pass | Vpc | 0 V | Vpc | 3 V | 1.5 V |
| Read B | Vr_pass | Vr_pass | Vr_pass | Vsense | Vr_pass | Vr_pass | 0 V | Vpc | 0 V | 3 V | 1.5 V |
| Read C | Vr_pass | Vr_pass | Vsense | Vr_pass | Vr_pass | Vr_pass | Vpc | 0 V | Vpc | 1.5 V | 3 V |
| Program A/Inhibit | Vpass | Vpass | Vpgm | Vpass | Vpass | Vpass | VDD | 0 V/VDD | VDD | 1.5 V | 1.5 V |
| Program B/Inhibit | Vpass | Vpass | Vpgm | Vpgm | Vpass | Vpass | 0 V/VDD | VDD | 0 V | 1.5 V | 1.5 V |
| Program C/Inhibit | Vpass | Vpass | Vpgm | Vpass | Vpass | Vpass | VDD | 0 V/VDD | VDD | 1.5 V | 1.5 V |
| Erase | 0 V | 0 V | 0 V | 0 V | 0 V | 0 V | F | F | F | F | F |

Vr_pass = 5 V,
Vsense = 0 V,
Vpc = 1 V,
VDD = 1.8 V,
Vpass = 10 V,
Vpgm = 18 V,
F = Floating For example, in order to perform the read operation for the selected memory cells A', A, and A", about 1.5 volts are applied to the first selection line SLO and about 3 volts are applied to the second selection line SLE such that both the two selection transistors connected to the memory strings MS[n−1], MS[n+1], and MS[n+3] to which the selected memory cells A', A, and A" belong are all turned on. The voltages applied to the remainder terminals, i.e., word lines and bit lines, are the same as those described with reference to FIG. 9.

Meanwhile, in order to perform a program operation for the selected memory cell A, first, about 1.5 volts are applied to the first selection line SLO and about 1.5 volts are applied to the second selection line SLE such that the bit lines BL[n−1] and BL[n+1] are connected to the source side of the selected memory cells A', A, and A" but the drain side is made in a floating state, and the bit lines BL[n] and BL[n+2] are connected to the drain side of the non-selected memory cells A', A, and A", but the source side is made in a floating state. About 0 volts, which is a program bit line voltage, is applied Therefore, a selective programming for the selected memory cells A', A, and A" is performed.

The erase operation is the same as that described with reference to FIG. 9. In other words, a ground voltage is applied to the word lines, the bit lines and the selection line are floated, and an erase voltage of about 18 volts is applied to the substrate.

Plan View and Sectional View for Memory Array

Figure 12A:
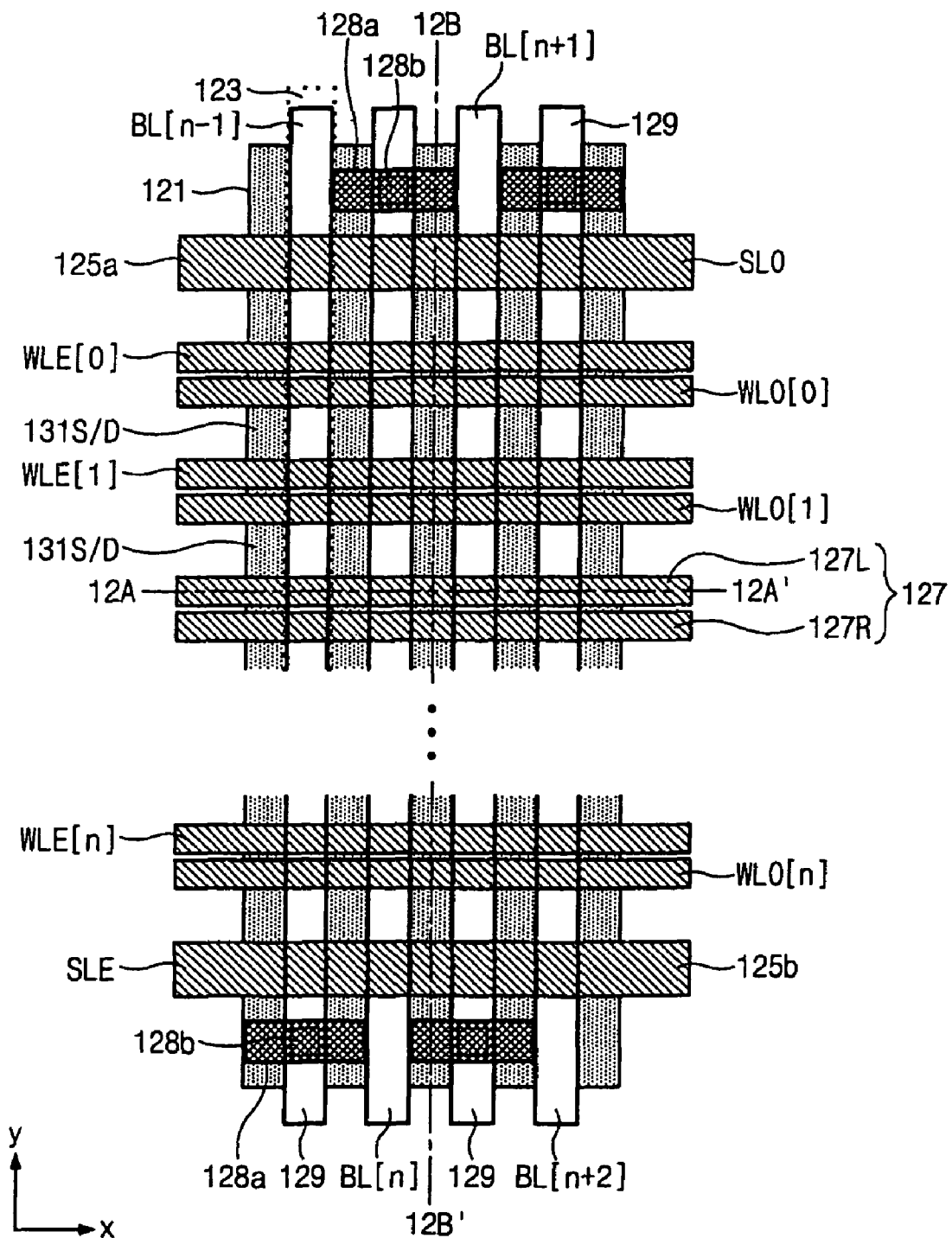
FIG. 12A is a plan view of the memory array architecture of FIG. 11.
Figure 12B:
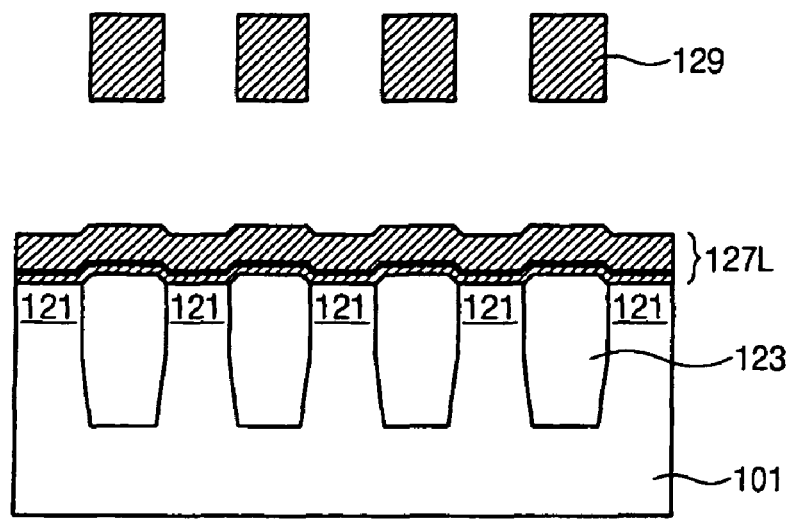
FIGS. 12B and 12C are sectional views taken along the lines 12A-12A' and 12B-12B' of FIG. 12A, respectively.
Figure 12C:
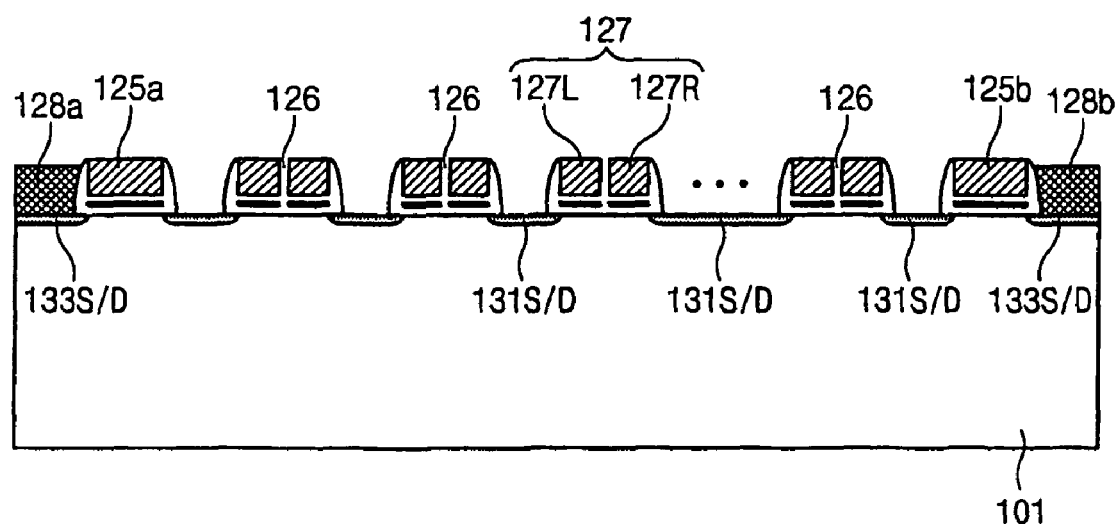

FIG. 12A is a plan view of the memory array architecture of FIG. 11, and FIGS. 12B and 12C are sectional views taken along the lines 12A-12A' and 12B-12B' of FIG. 12A, respectively.

The memory array architecture shown in FIGS. 12A through 12C is the same as that shown in FIGS. 10A through 10C except that two selection transistors are connected to one memory string. Accordingly, the memory array architecture shown in FIGS. 12A through 12C can attain a higher integration than that shown in FIGS. 10A through 10C.

Third Memory Array Architecture

Figure 13:
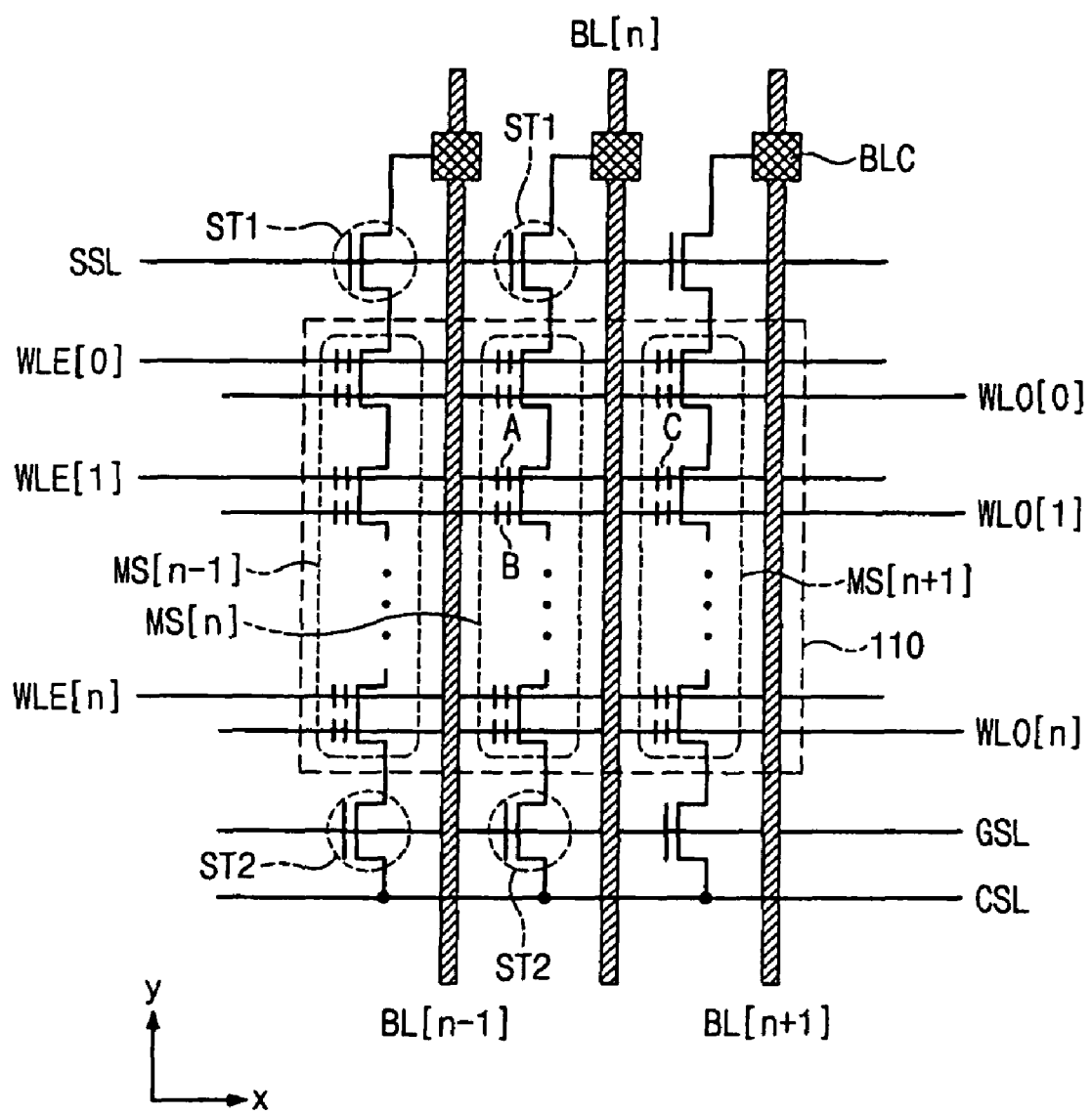
FIG. 13 is an illustration of a memory array architecture according to another embodiment of the present invention.

FIG. 13 is an illustration of a memory array architecture for a new memory device of the present invention disclosed in FIGS. 6A through 8A.

Unlike the first memory array of FIG. 9 and the second memory array of FIG. 11, the memory array of FIG. 13 does not employ a virtual ground but employs a common source line.

Referring to FIG. 13, the memory array includes a memory region 110 in which a plurality of unit memory cells shown in FIGS. 6A through 8A are arranged in a matrix configuration. A predetermined number of unit memory cells (e.g., 16 unit memory cells) are connected in the column direction to form one memory string.

FIG. 13 shows three memory strings MS[n−1], MS[n], and MS[n+1]. A string selection transistor ST1 is connected to the first memory cell of each memory string and a ground selection transistor ST2 is connected to the last memory cell.

Gates of the string selection transistors in the row direction form a string selection line SSL and gates of the ground selection transistors in the row direction form a ground selection line GSL. Gates of the memory cells in the row direction form word lines WLE[0], WLO[0], WLE[1] and WLO[1], . . . . WLE[n] and WLO[n]. The corresponding bit line is electrically connected to the drain of each of the string selection transistors ST1 through a bit line contact BLC, and the sources of the ground selection transistors ST2 are connected to each other to form a common source selection line CSL.

In the memory array of FIG. 13, read, program, and erase operations for memory cells A. B, and C will be summarized as shown in the following table 3.

ST1 and ST2 are turned on. The selected bit line BL[n] is precharged by applying the precharge voltage Vpc to the selected bit line BL[n] connected to the memory string to which the selected memory cell A belongs. A ground voltage (about 0 volts) is applied to the non-selected bit lines BL[n−1] and BL[n+1]. The sense voltage Vsense (e.g., 0 volts) having a value between the threshold voltage (e.g., −3 volts) of the first state and the threshold voltage (e.g., 3 volts) of the second state is applied to the selected word line WLE[1] connected to the selected memory cell A. The read pass voltage Vr_pass of about 4 to about 6 V, which is higher than the threshold voltages of the first and second states, is applied to all non-selected word lines except the selected word line, such that the non-selected memory cells are turned on without regard to the states. Therefore, depending on the information stored in the selected memory cells A, a channel is formed or not formed below the corresponding memory cells, i.e., current flows or does not flow.

If the threshold voltage of the selected memory cell A is higher than about 0 volts (second state), the current flowing through the memory cell is very small and is negligible, whereas if the threshold voltage is lower than about 0 volts (first state), a current of a few hundred nA to tens of mA flows, so that a voltage Vpc precharged in the selected bit lines BL[n] drops towards 0 volts. Accordingly, a page buffer circuit connected to the selected bit lines BL[n] detects the voltages of the selected bit lines BL[n] after an elapse of a set time and if the detected voltage drops below a few hundreds mV from the precharged voltage Vpc, it outputs logic '1'

TABLE 3

| | WLE[0] | WLO[0] | WLE[1] | WLO[1] | WLE[n] | WLO[n] | BL[n−1] | BL[n] | BL[n+1] | GSL | SSL |
|---|---|---|---|---|---|---|---|---|---|---|---|
| Read A | Vr_pass | Vr_pass | Vsense | Vr_pass | Vr_pass | Vr_pass | 0 V | Vpc | 0 V | Vcc | Vcc |
| Read B | Vr_pass | Vr_pass | Vr_pass | Vsense | Vr_pass | Vr_pass | 0 V | Vpc | 0 V | Vcc | Vcc |
| Read C | Vr_pass | Vr_pass | Vsense | Vr_pass | Vr_pass | Vr_pass | Vpc | 0 V | Vpc | Vcc | Vcc |
| Program A/Inhibit | Vpass | Vpass | Vpgm | Vpass | Vpass | Vpass | VDD | 0 V/VDD | VDD | 0 V | Vcc |
| Program B/Inhibit | Vpass | Vpass | Vpass | Vpgm | Vpass | Vpass | VDD | 0 V/VDD | VDD | 0 V | Vcc |
| Program C/Inhibit | Vpass | Vpass | Vpgm | Vpass | Vpass | Vpass | VDD | VDD | 0 V/VDD | 0 V | Vcc |
| Erase | 0 V | 0 V | 0 V | 0 V | 0 V | 0 V | F | F | F | F | F |

Vr_pass = 5 V,
Vsense = 0 V,
Vpc = 1 V,
VDD = 1.8 V,
Vpass = 10 V,
Vpgm = 18 V,
F = Floating,
VDD ≤ Vcc ≤ Vr_pass,
Vcc = Turn on voltage of string election transistor and ground selection transistor Operation of the memory array will now be described with reference to FIG. 13 and table 3.

Read Operation

A read operation for a memory cell A will be described below. When the selected memory cell A belongs to the even column, the read operation can be simultaneously performed on all of the memory cells of the even column, which are connected to the selected word line to which the selected memory cell A is connected.

A turn on voltage Vcc that is higher than VDD and lower than Vr_pass is applied to the string selection line SSL and the ground selection line GSL, such that the selection transistors which is an erase state, and if the detected voltage does not drop below a few hundreds mV, it outputs logic '0' which is a program state.

Program Operation

Next, program operation for the selected memory cell A will be described. When the selected memory cell A belongs to the even column, the program operation can be simultaneously performed on the memory cells of the even column, which are connected to the selected word line to which the selected memory cell A is connected.

The voltage Vcc that is higher than VDD and lower than Vr_pass is applied to the string selection line SSL and a ground voltage is applied to the ground selection line GSL. About 0 volts is applied to the bit line BL[n] to which the selected memory cell A is connected, and VDD of about 1.8 volts, which is the program preventing bit line voltage, is applied to the non-selected bit lines BL[n−1] and BL[n+1]. Then, if the program pass voltage Vpass of about 10 volts is applied to the non-selected word lines, the channel of the memory string to which the selected memory cells belong is connected to the state of about 0 volts, and the channel of the non-selected memory cells is precharged to a positive low voltage higher than about 0 volts, for example, about VDD−Vt (where Vt is the threshold voltage of the selected transistor). If the program word line voltage Vpgm of about 18 volts is applied to the selected word line WLE[1] to which the selected memory cell A is connected, electrons are injected from the channel region into the charge trap layers of the selected memory cells due to the F-N tunneling phenomenon by a high electrical field between the selected memory cell A and the channel, so that the threshold voltage is increased. However, since the voltage of the channel region of the non-selected memory cells C precharged to VDD−Vt increases to a voltage of more than VDD−Vt due to the boosting effect caused by the gate capacitor between the gate and the channel of the non-selected memory cell, F-N tunneling does not occur in the non-selected memory cells C and therefore the memory cells are not programmed.

Erase Operation

An example erase operation for the memory array of the present invention can occur in page units or in block units comprised of a plurality of pages.

The erase operation uses F-N tunneling. The ground selection line GSL, the string selection line SSL, and the bit lines are floated, and the ground voltage is applied to the word lines. Then, when the program voltage of about 18 volts is applied to the substrate, the electrons trapped in the charge trap layer are emitted to the substrate.

Method of Forming Memory Device and Array

Hereinafter, a method of forming a memory device according to a preferred embodiment of the present invention will be described with reference to FIGS. 14 through 20.

Figure 14:
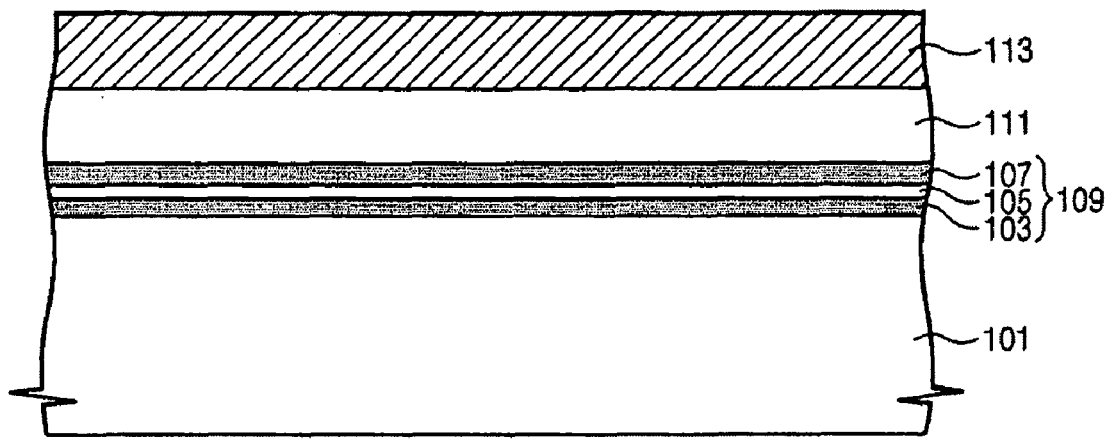
FIGS. 14 through 20 are sectional views illustrating a method of forming a memory cell according to an embodiment of the present invention.

Referring to FIG. 14, a P-type substrate 101 is prepared in a general method. For example, a device isolation layer is formed and a memory layer 109 having a charge trap layer is formed on the substrate. The memory layer 109 includes a tunnel oxide layer 103, a charge trap layer 105, and a blocking insulating layer 107, which are sequentially stacked on the substrate.

The tunnel oxide layer 103 may be formed in a thickness range of about 35 to about 40 Å by a thermal oxidation process or a well-known thin film deposition process. The charge trap layer 105 may be a nitride layer formed in a thickness range of about 70 to about 150 Å by a well-known thin film deposition process. The blocking insulating layer 107 may be an oxide layer formed in a thickness range of about 100 to about 200 Å by a well-known thin film deposition process.

A hard mask layer 113 is formed on a gate conductive layer 111. The hard mask layer 113 may be a silicon nitride layer or a silicon oxide layer formed by a well-known thin film deposition process.

Figure 15:
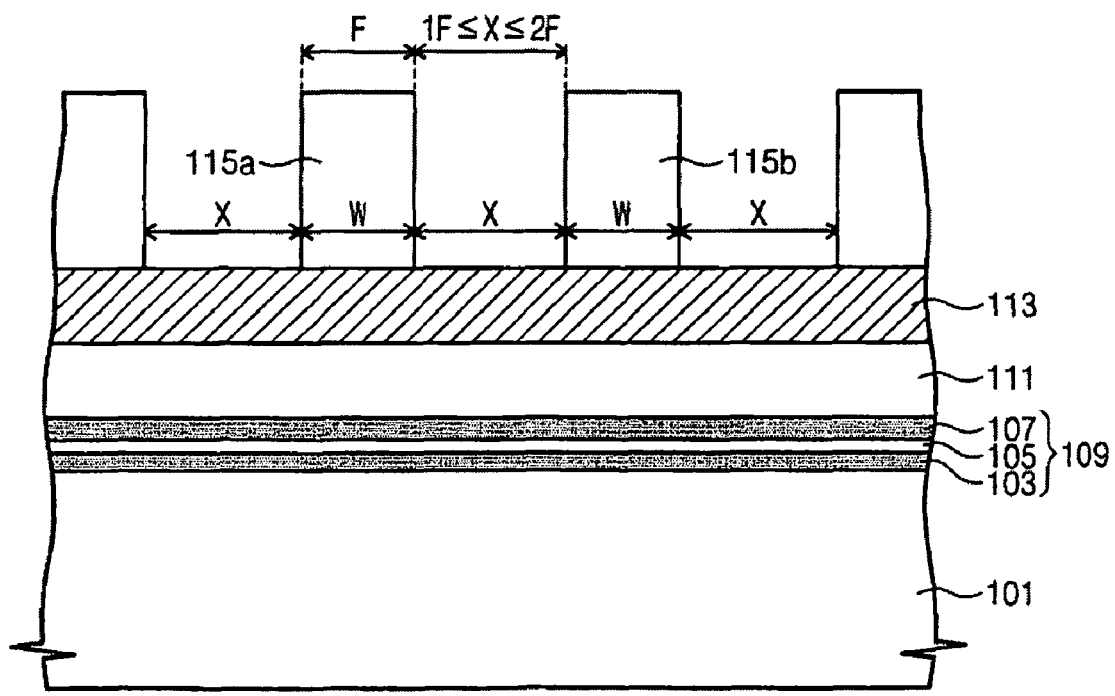

Referring to FIG. 15, dummy patterns 115a and 115b are formed on the hard mask layer 113 by a photolithography process. The dummy patterns 115a and 115b may be formed of photoresist patterns or material layer patterns (e.g., undoped polysilicon patterns) having a high etching selectivity with respect to the hard mask layer 113.

A line width W of each of the dummy patterns 115a and 115b is formed to have a minimum line width F that can be allowed by the photolithography process. A distance X between the adjacent dummy patterns 115a and 115b is designed to have more than the minimum line width and less than twice the minimum line width (F≦X≦2F). The distance X between the adjacent dummy patterns is determined by the final thickness of a gate, which will be formed later, and a distance between adjacent gates.

Figure 16:
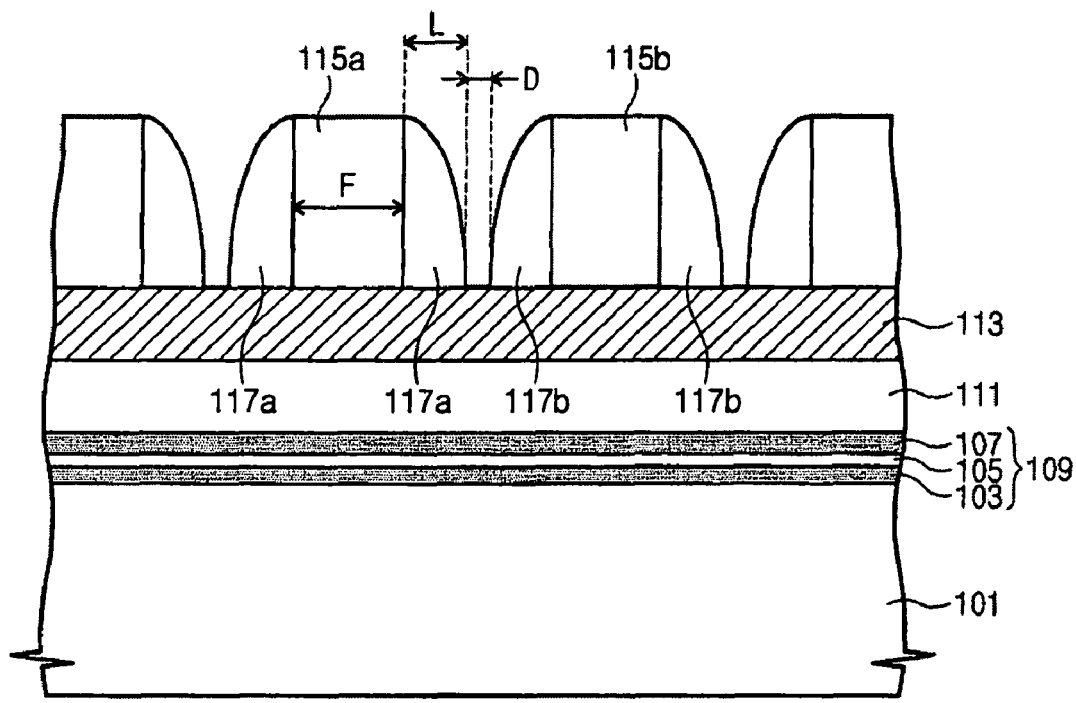

Referring to FIG. 16, insulating spacers 117a and 117b are formed on both sidewalls of each of the dummy patterns 115a and 115b. The insulating spacers 117a and 117b may be formed by depositing insulating material and etching back the deposited insulating material. The insulating spacers 117a and 117b are formed of material having an etching selectivity with respect to the hard mask layer 113. As one example, if the hard mask layer 113 is formed of a silicon oxide layer, the insulating spacers 117a and 117b are formed of a silicon nitride layer. As another example, when the hard mask layer 113 is formed of a silicon nitride layer, the insulating spacers 117a and 117b are formed of a silicon oxide layer. At this point, the width L of each of the insulating spacers 117a and 117b is less than half the distance X between the adjacent dummy patterns (L<(X/2)). Accordingly, the insulating spacers are formed in the different dummy patterns, and the distance D between two adjacent spacers is less than the minimum line width F. For example, the distance D between the spacer 117a of the dummy pattern 115a and the spacer 117b of the adjacent dummy pattern 115b is less than the minimum line width F (D<F). Two memory cells of unit memory cell are defined by two spacers belonging to the different dummy patterns.

Figure 17:
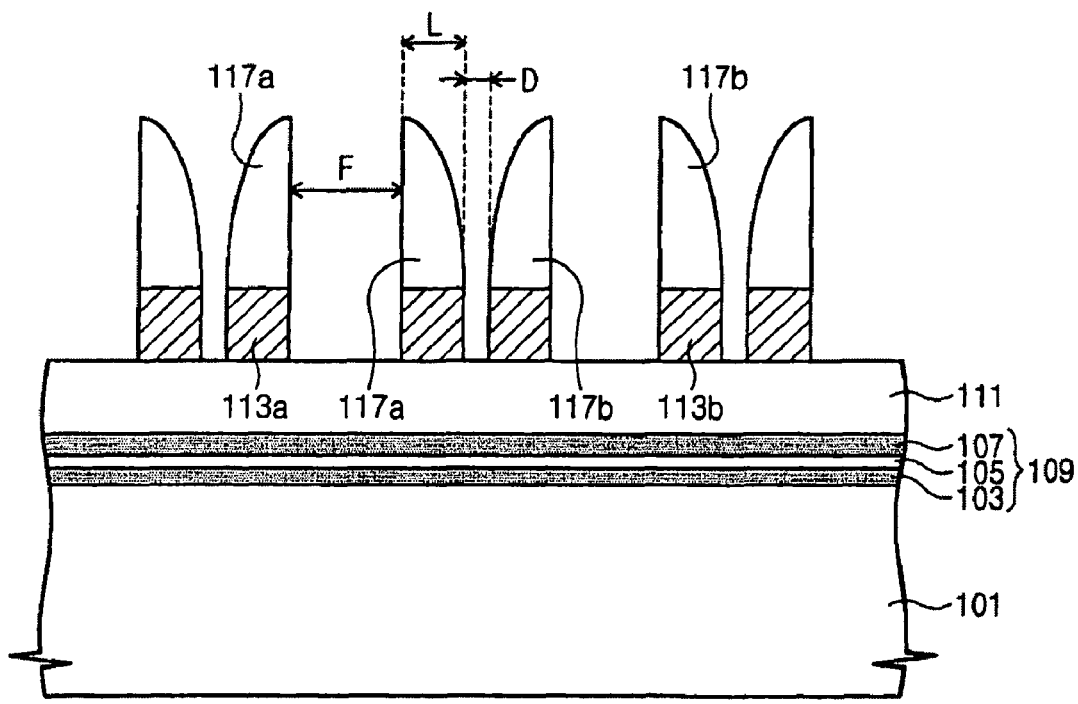
Figure 18:
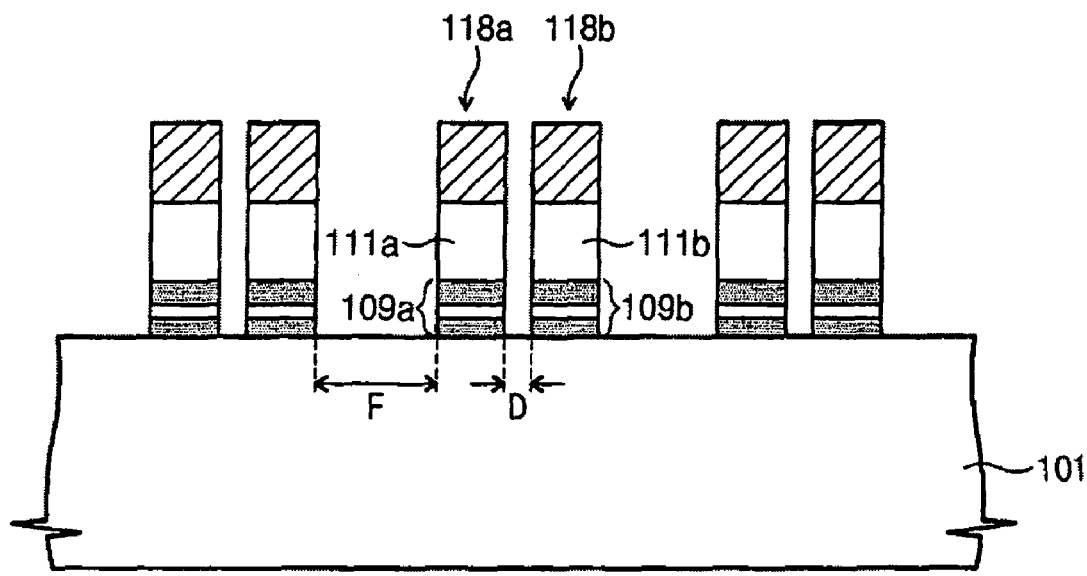

Referring to FIG. 17, after removing the dummy patterns 115a and 115b, the exposed hard mask layer 113 is etched using the spacers 117a and 117b as an etching mask, thereby forming hard mask patterns 113a and 113b having a width substantially equal to that L of the spacer. Unit pairs of the hard mask patterns 113a and 113b spaced apart by a distance D less than the minimum line width F are formed, and a plurality of unit pairs of hard mask patterns are formed spaced apart from one another by the minimum line width F. Referring to FIG. 18, after removing the spacers 117a and 117b, the conductive layer 111 and the memory layer 109 are etched using the hard mask patterns 113a and 113b as an etching mask, thereby forming memory cells 118a and 118b including conductive layer patterns 111a and 111b and memory layer patterns 109a and 109b. Two adjacent memory cells 118a and 118b spaced apart by the distance D define the unit memory cell.

Figure 19:
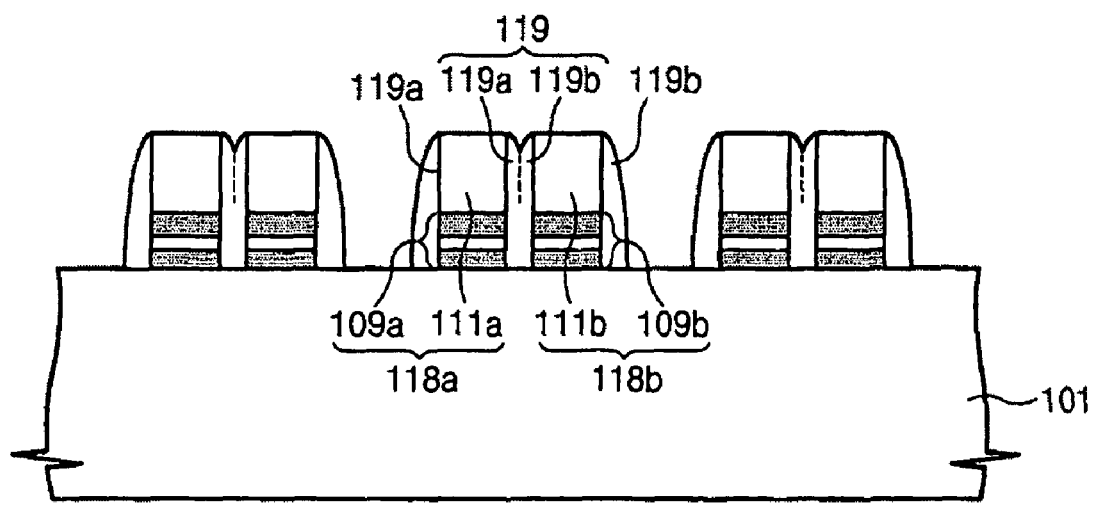
Figure 20:
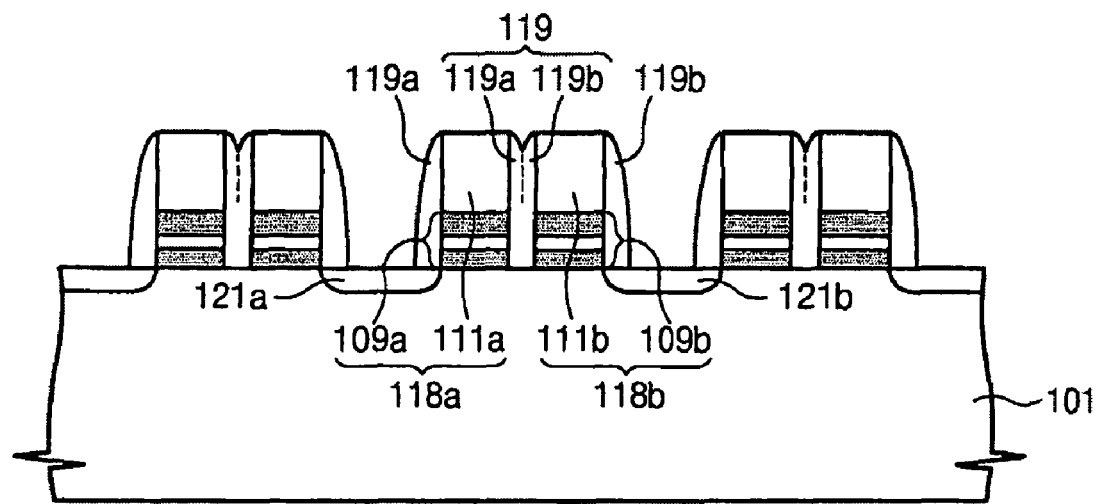

Referring to FIG. 19, insulating material having no charge trap region is deposited and etched back to form non-charge trapping spacers 119a and 119b on both sidewalls of each of the memory cells 118a and 118b. At this point, since the distance D between the two adjacent memory cells 118a and 118b of the unit memory cell is short, a space between the two adjacent memory cells 118a and 118b is filled with the adjacent non-charge trapping spacers 119a and 119b, whereby non-charge trapping layer 119 is formed. Referring to FIG. 20, junction regions 121a and 121b serving as source/drain are formed in an outer side of the unit memory cell on the substrate by an impurity ion implantation process.

In the memory array, the selection transistors may be formed together with the memory cells, but it is preferable that the selection transistors be formed by a separate photolithography process. For example, after the memory cells are formed, gates for the selection transistors are formed by a photolithography process. Alternatively, after gates for the selection transistors are formed, the memory cells are formed. Sources/drains for the selection transistors are formed together with those for the memory cells.

Also, gate insulation layers for insulating the gates of the selection transistors from the substrate may be formed differently from ONO layers of the memory cells. For example, the gate insulation layers of the selection transistors are formed of thermal oxide layers. For this purpose, after regions for the selection transistors are protected using a photoresist or the like, ONO memory layers are formed in the memory regions. Then, the memory regions where the ONO memory layers have been formed are protected using a photoresist or the like. Thereafter, thermal oxide layers are formed in regions where the selection transistors are to be formed. The ONO memory layers of the memory cells may be formed after the gate insulation layers of the selection transistors are formed.

The selection transistors may have different threshold voltages by separately performing an ion implantation process for controlling the threshold voltage. For example, a first ion implantation process is performed after exposing the region where the first selection transistor having a first threshold voltage is to be formed, and a second ion implantation process is then performed after exposing the region where the second selection transistor having a second threshold voltage is to be formed.

In the memory array of FIGS. 9 through 11, the selection transistors of the adjacent memory strings are connected together by a contact pad. The contact pad is formed by deposition of conductive material and photolithography process. After forming an interlayer insulation layer, a photolithography process is performed to form a bit line contact hole exposing the contact pad. Then, a conductive material for a bit line is deposited and patterned to form a bit line. Meanwhile, in the memory array of FIG. 13, after forming the interlayer insulation layer, the bit line contact hole is formed to expose the drain region of the selection transistor.

Figure 21:
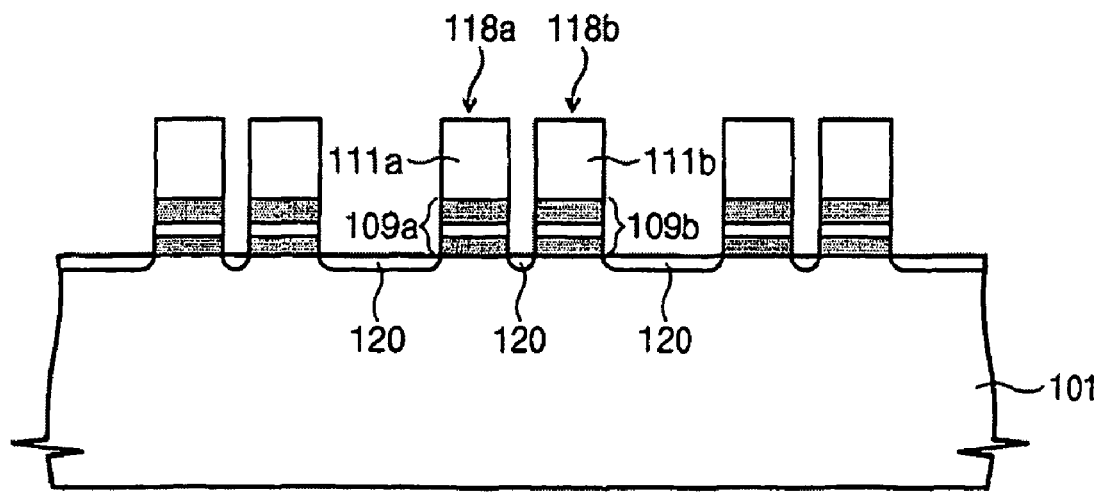
FIGS. 21 and 22 are sectional views illustrating a method of forming a memory cell according to another embodiment of the present invention.

A method of forming a memory device according to another embodiment of the present invention will now be described in detail with reference to FIGS. 21 and 22. Referring to FIG. 21, the processes described above with reference to FIGS. 14 through 18 are performed and a low-concentration impurity ion implantation process is then performed. Accordingly, a low-concentration impurity diffusion region 120 is formed between two adjacent memory cells 118a and 118b constituting the unit memory cell. At this point, the low-concentration impurity diffusion region 120 is formed in an outside of the memory cells 118a and 118b. The low-concentration impurity diffusion region 120 may be formed by implanting arsenic (As) ions in a dose range of about $5 \times 10^{14}$ to about $1 \times 10^{15}$ atoms/cm² in an energy range of about 10 to about 30 keV. In the case of a P-channel memory cell, boron (B) ions are implanted under the same conditions.

Figure 22:
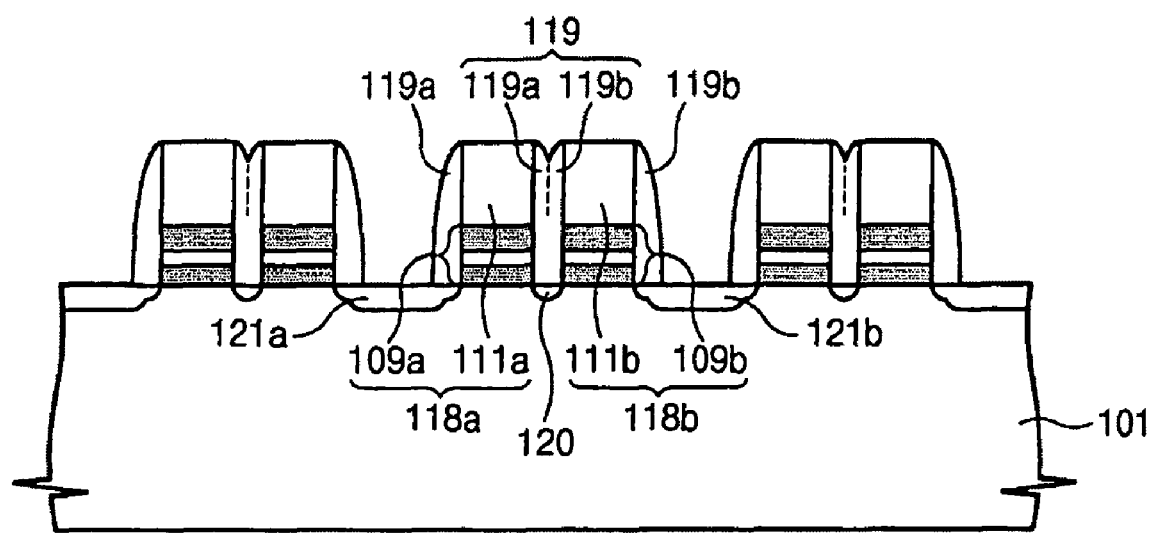

Referring to FIG. 22, an insulating material having no charge trap region is deposited and etched back to form spacers 119a and 119b on both sidewalls of each of the memory cells 118a and 118b. At this point, since the distance D between the two adjacent memory cells 118a and 118b is short, a space between the two adjacent memory cells 118a and 118b is filled with the adjacent insulating spacers 119a and 119b, whereby non-charge trapping layer 119 is formed. Then, a high-concentration impurity ion implantation process for the source/drain is performed to form junction regions 121a and 121b in an outside of the two memory cells 118a and 118b insulated from each other by the non-charge trapping layer 119. The junction regions 121a and 121b may be formed by implanting phosphorus (P) ions in a dose range of about $1 \times 10^{15}$ to about $5 \times 10^{15}$ atoms/cm² in an energy range of about 10 to about 30 keV. In the case of a P-channel memory cell, boron (B) ions are implanted under the same conditions.

According to the embodiments of the present invention, the memory device includes two control gates physically separated by the insulating layer not having a charge trap site between the drain and the source, and the memory layer having the charge trap layer storing charges between each control gate and the channel of the substrate. Accordingly, a proper combination of voltages is applied to the drain, the source, the substrate, and the gates so that electrons and holes are selectively or wholly injected/emitted into the charge trap layer to vary the threshold voltage of the memory device.

According to the above-described memory array architectures of the present invention, the program and read operations can be performed on the selection memory cells without influence of the adjacent cells.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A memory array comprising:
   a first selection line and a second selection line running in a first direction, wherein first and second selection transistors are alternatively connected to each of the first and second selection lines,
   wherein the first selection line includes an upper fist selection and a lower first selection line and the second selection line includes an upper second selection line and a lower second selection line;
   a plurality of word lines interposed between the upper first selection line and the lower second selection line and running in the first direction;
   a plurality of memory cells arranged in the first direction are connected to each of the word lines, a predetermined number of the memory cells arranged in a second direction perpendicular to the first direction form memory strings, and the first memory cells of the memory strings are connected to the selection transistors of the upper first selection line and the last memory cells are connected to the selection transistors of the lower second selection line; and
   a plurality of bit lines running in the second direction, wherein each of the bit lines is connected to the first and second selection transistors between the adjacent memory strings such that the first and last memory cells of each of the memory strings are connected to the adjacent bit lines.

2. The memory array of claim 1, wherein the first selection transistor has a first threshold voltage and the second selection transistor has a second threshold voltage.

3. The memory array of claim 1, wherein in one of the memory strings, in the first memory cell, the first selection transistor is connected before the second selection transistor.

4. The memory array of claim 1, wherein in one of the memory strings, in the last memory cell, the second selection transistor is connected before the first selection transistor.

5. The memory array of claim 1, wherein between the adjacent memory strings, the first and second selection transistors are connected in inverse orders.

6. The memory array of claim 1, wherein the first and second selection transistors are alternatively connected to each of the first and second selection lines such that the first and second selection transistors are connected in a same order in the upper and lower first selection lines and in the upper and lower second selection lines and are connected in an opposite order between the first selection line and the second selection line.

* * * * *